(12) United States Patent
Kim et al.

(10) Patent No.: US 11,088,082 B2
(45) Date of Patent: Aug. 10, 2021

(54) SEMICONDUCTOR DEVICE WITH PARTIAL EMI SHIELDING AND METHOD OF MAKING THE SAME

(71) Applicant: STATS ChipPAC Pte. Ltd., Singapore (SG)

(72) Inventors: Changoh Kim, Incheon (KR); Kyounghee Park, Seoul (KR); Kyowang Koo, Incheon (KR); Sungwon Cho, Seoul (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 16/116,485

(22) Filed: Aug. 29, 2018

(65) Prior Publication Data

US 2020/0075502 A1    Mar. 5, 2020

(51) Int. Cl.

| | |
|---|---|
| H01L 23/552 | (2006.01) |
| H01L 23/31 | (2006.01) |
| H01L 23/04 | (2006.01) |
| H01L 25/065 | (2006.01) |
| H01L 21/78 | (2006.01) |
| H01L 25/00 | (2006.01) |
| H01L 21/56 | (2006.01) |

(52) U.S. Cl.
CPC .......... *H01L 23/552* (2013.01); *H01L 21/56* (2013.01); *H01L 21/78* (2013.01); *H01L 23/04* (2013.01); *H01L 23/3121* (2013.01); *H01L 25/0655* (2013.01); *H01L 25/50* (2013.01)

(58) Field of Classification Search
None
See application file for complete search history.

(56) References Cited

U.S. PATENT DOCUMENTS

| | | | |
|---|---|---|---|
| 6,257,224 B1* | 7/2001 | Yoshino | B28D 5/0005 125/13.01 |
| 8,952,552 B2 | 2/2015 | Zang et al. | |
| 9,332,646 B2 | 5/2016 | Chen et al. | |
| 2010/0047970 A1* | 2/2010 | Eichelberger | H01L 23/5389 438/121 |
| 2015/0332938 A1* | 11/2015 | Palm | H01L 21/561 257/723 |
| 2016/0006133 A1* | 1/2016 | Ganchrow | H01Q 1/2283 343/879 |
| 2017/0077039 A1* | 3/2017 | Liao | H01L 23/3121 |
| 2017/0186699 A1* | 6/2017 | Li | H01L 21/31105 |

\* cited by examiner

*Primary Examiner* — Anthony Ho
*Assistant Examiner* — Kevin Quinto
(74) *Attorney, Agent, or Firm* — Brian M. Kaufman; Robert D. Atkins; Patent Law Group: Atkins & Associates, P.C.

(57) ABSTRACT

A semiconductor device has a substrate. A lid is disposed over the substrate. An encapsulant is deposited over the substrate. A film mask is disposed over the encapsulant with the lid exposed from the film mask and encapsulant. A conductive layer is formed over the film mask, encapsulant, and lid. The film mask is removed after forming the conductive layer.

23 Claims, 24 Drawing Sheets

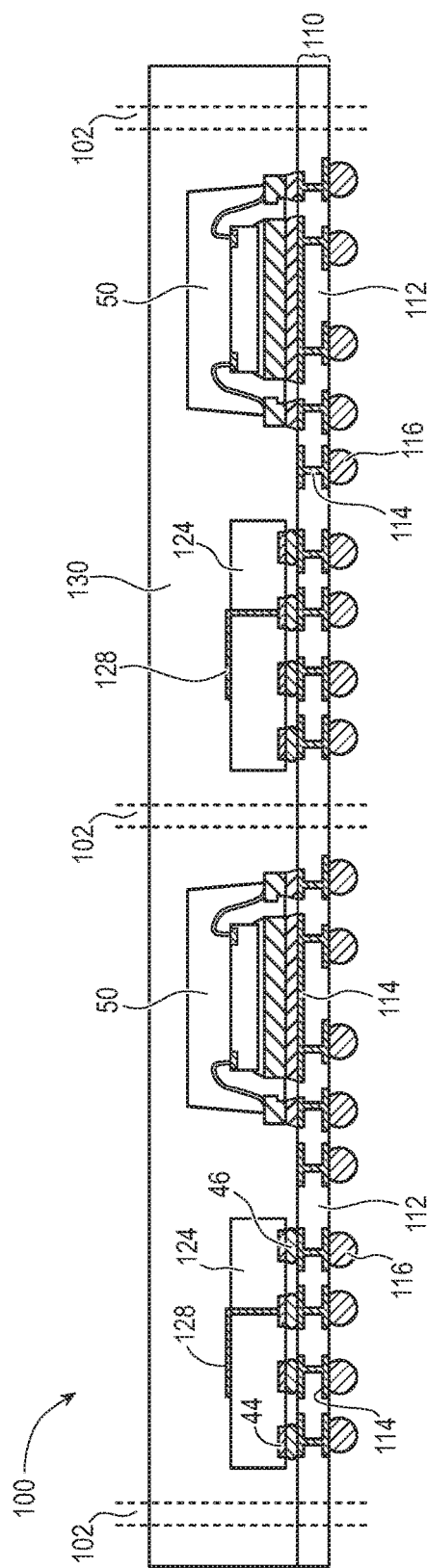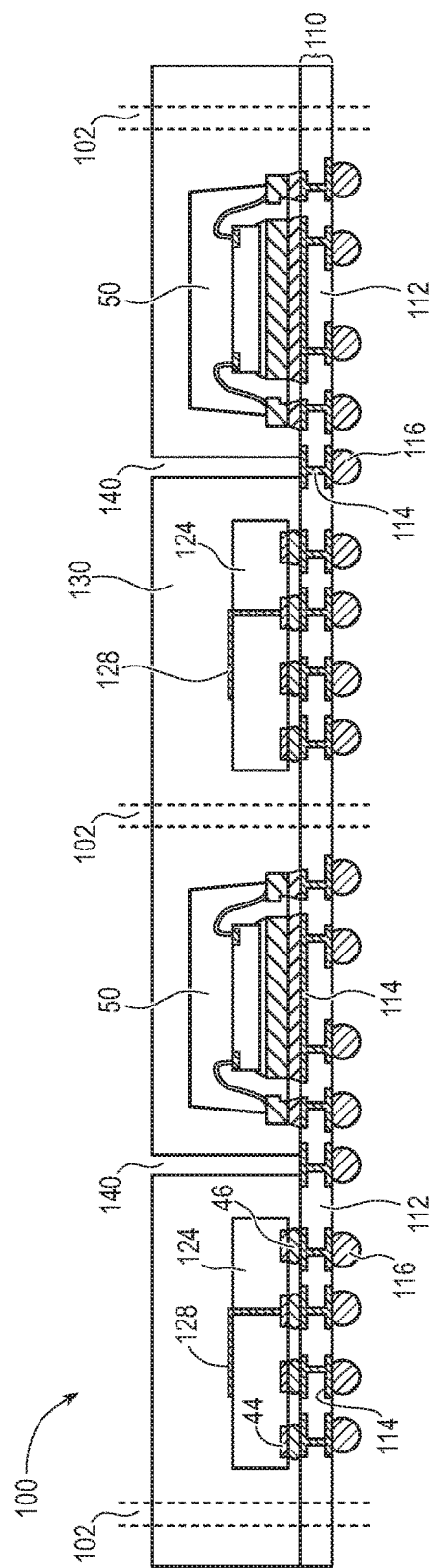

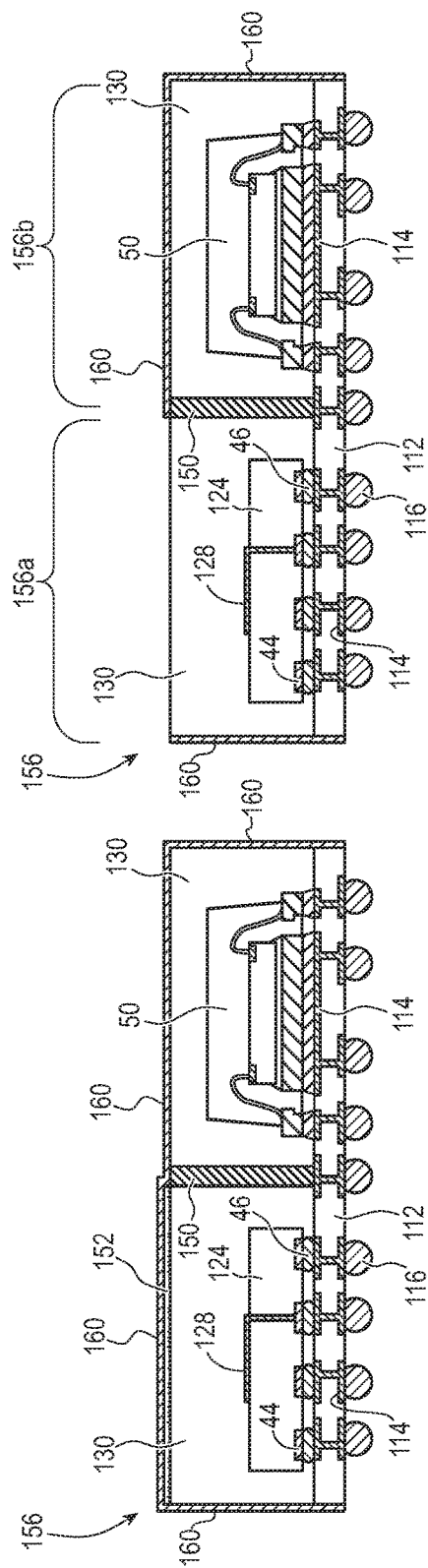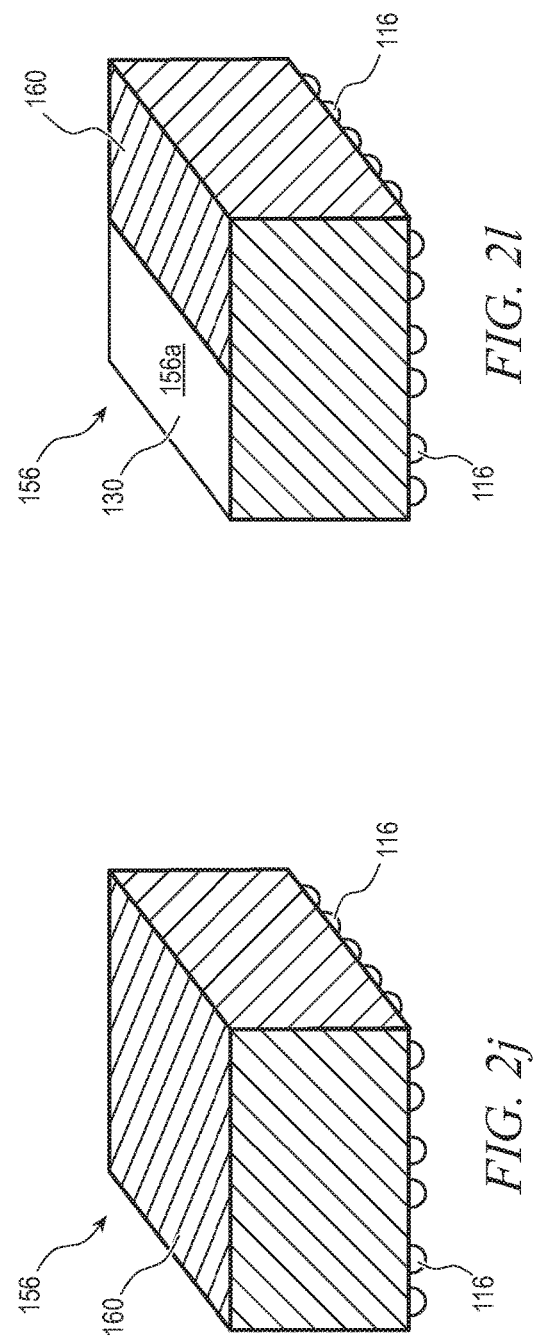

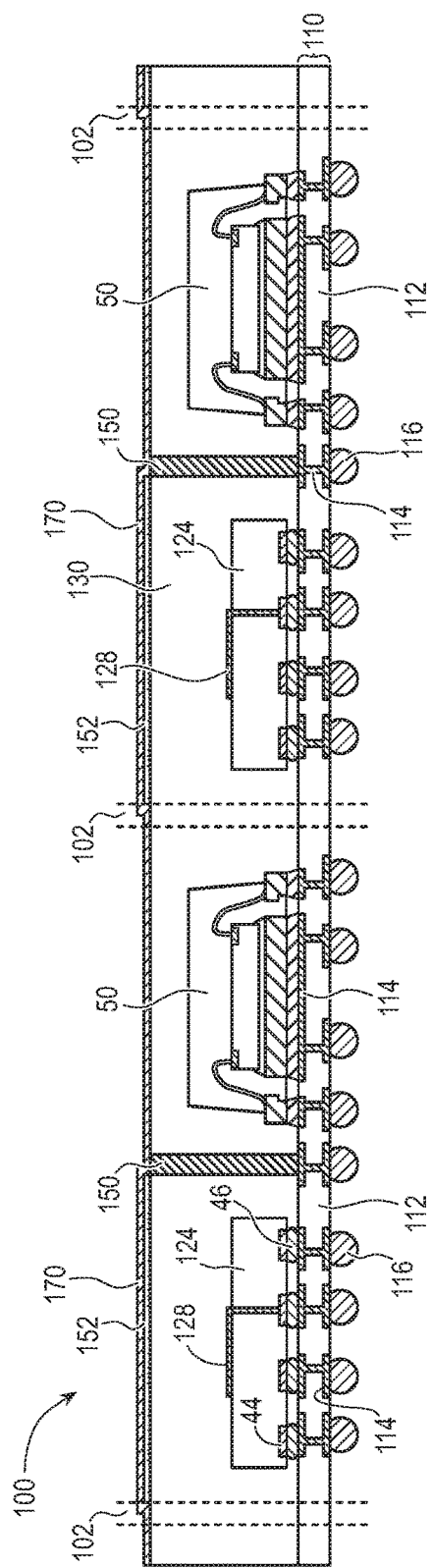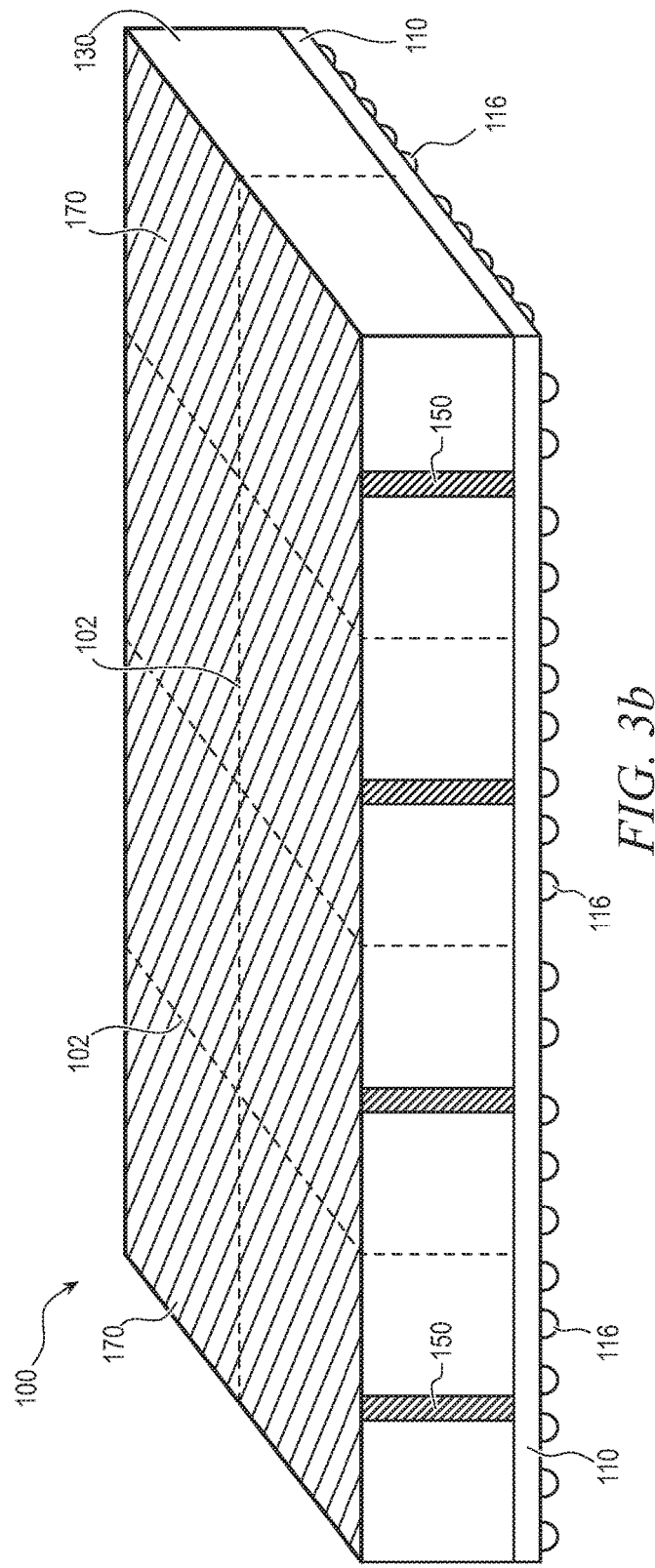
FIG. 3a
FIG. 3b

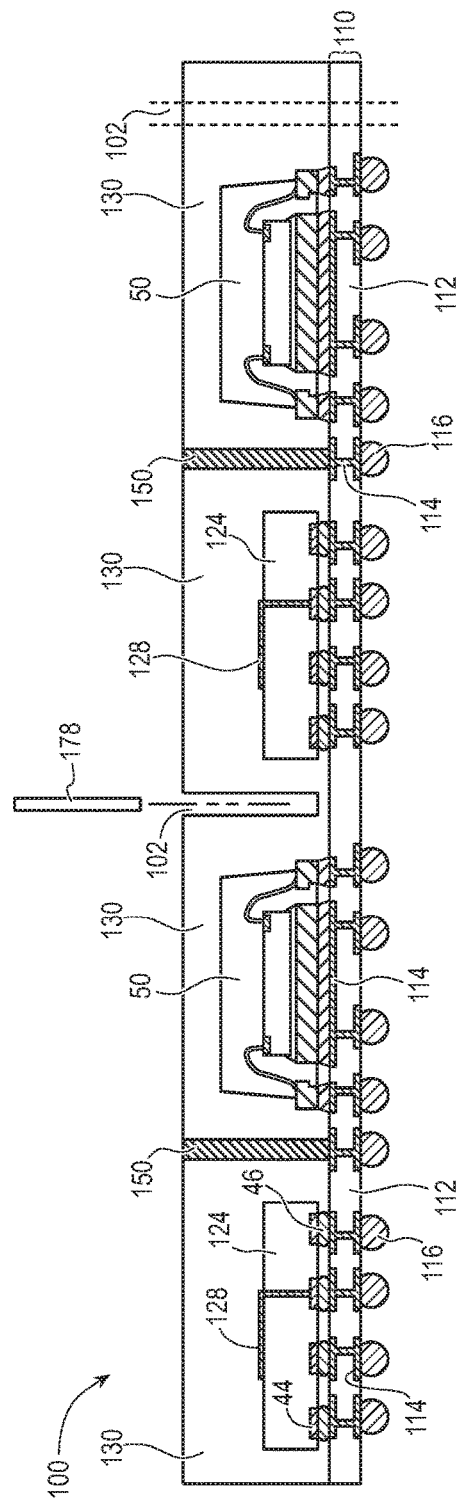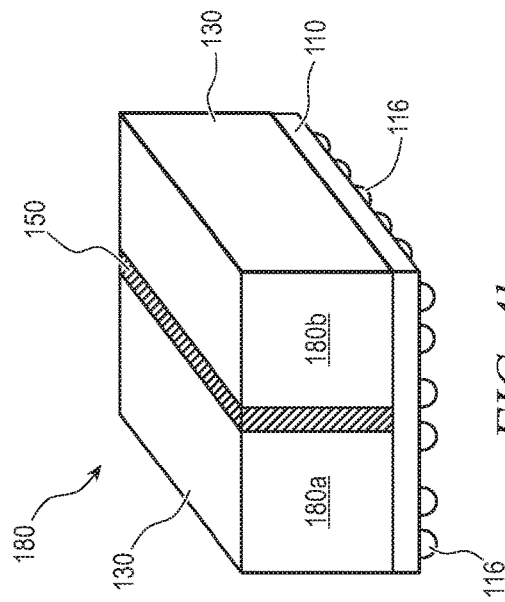
FIG. 4a
FIG. 4b

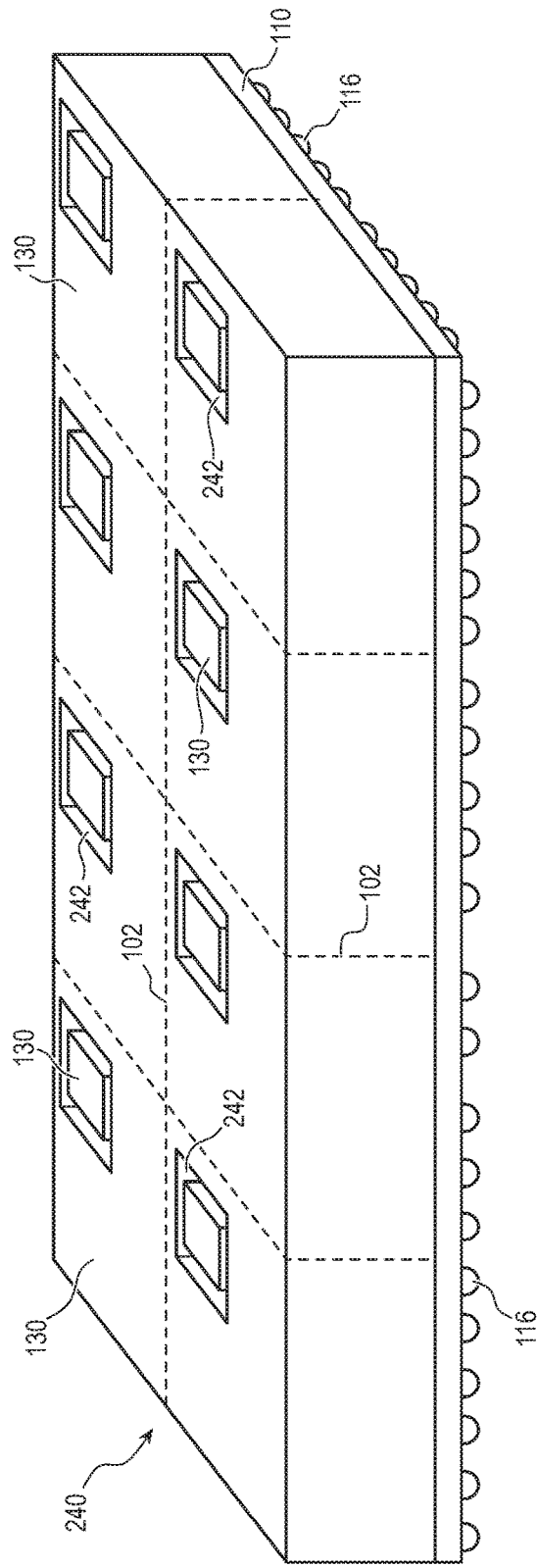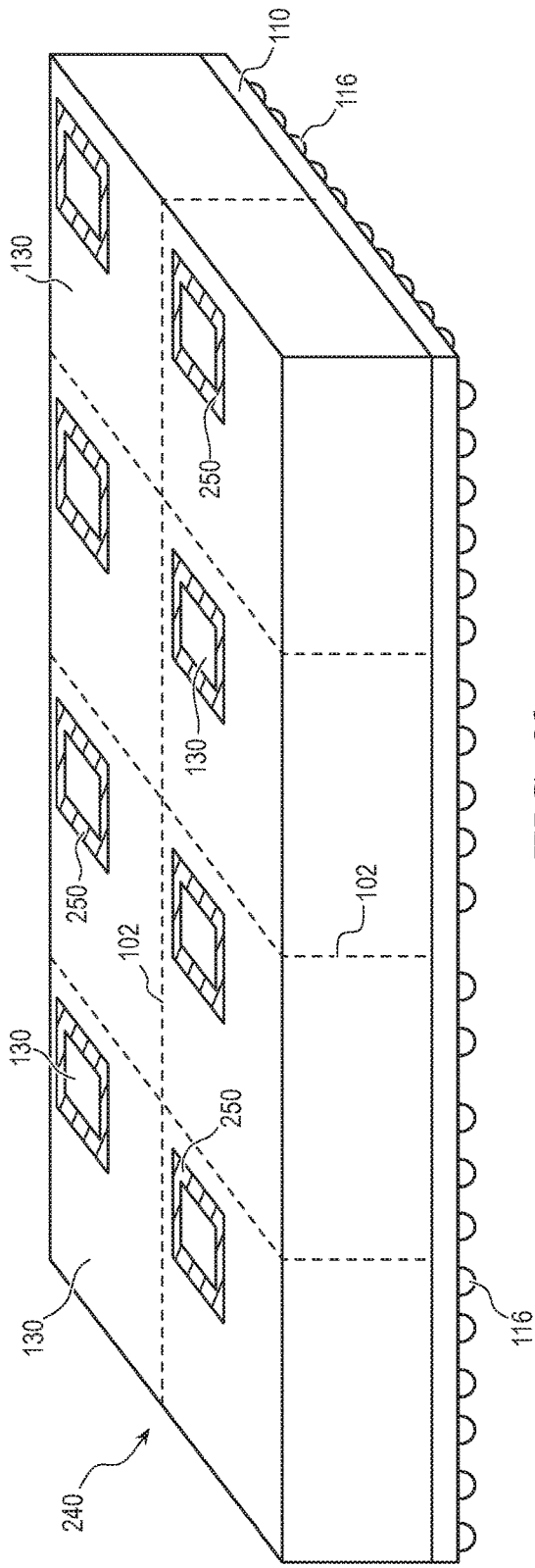

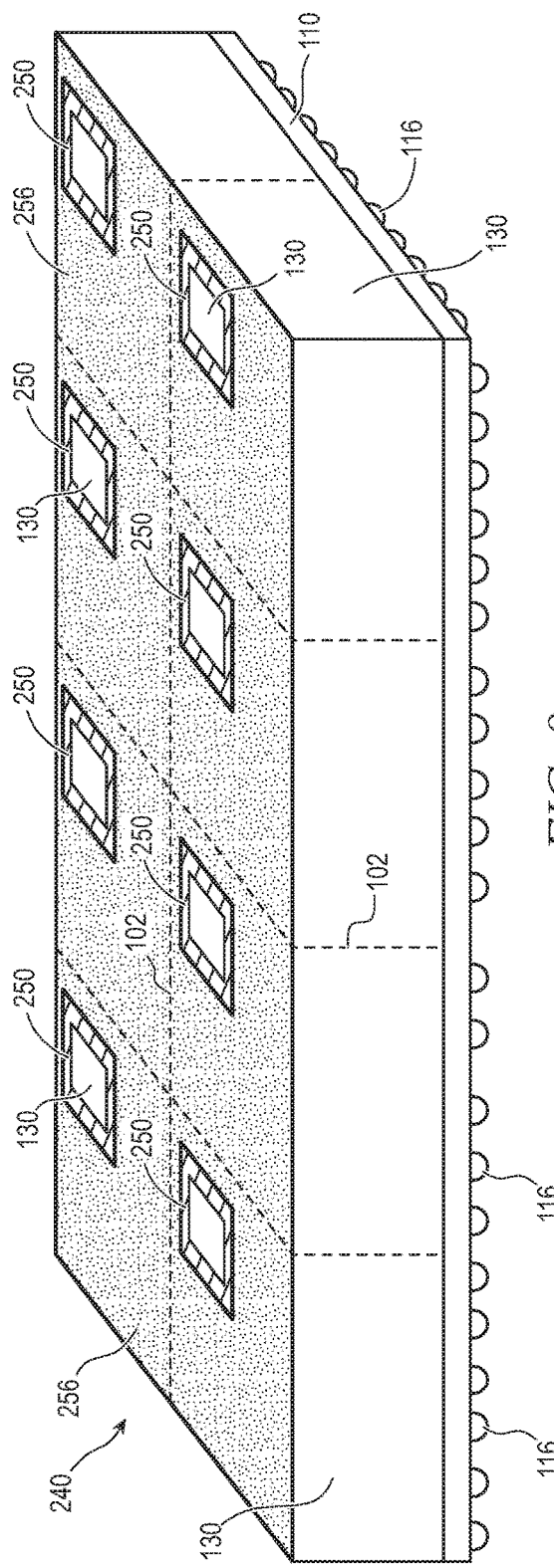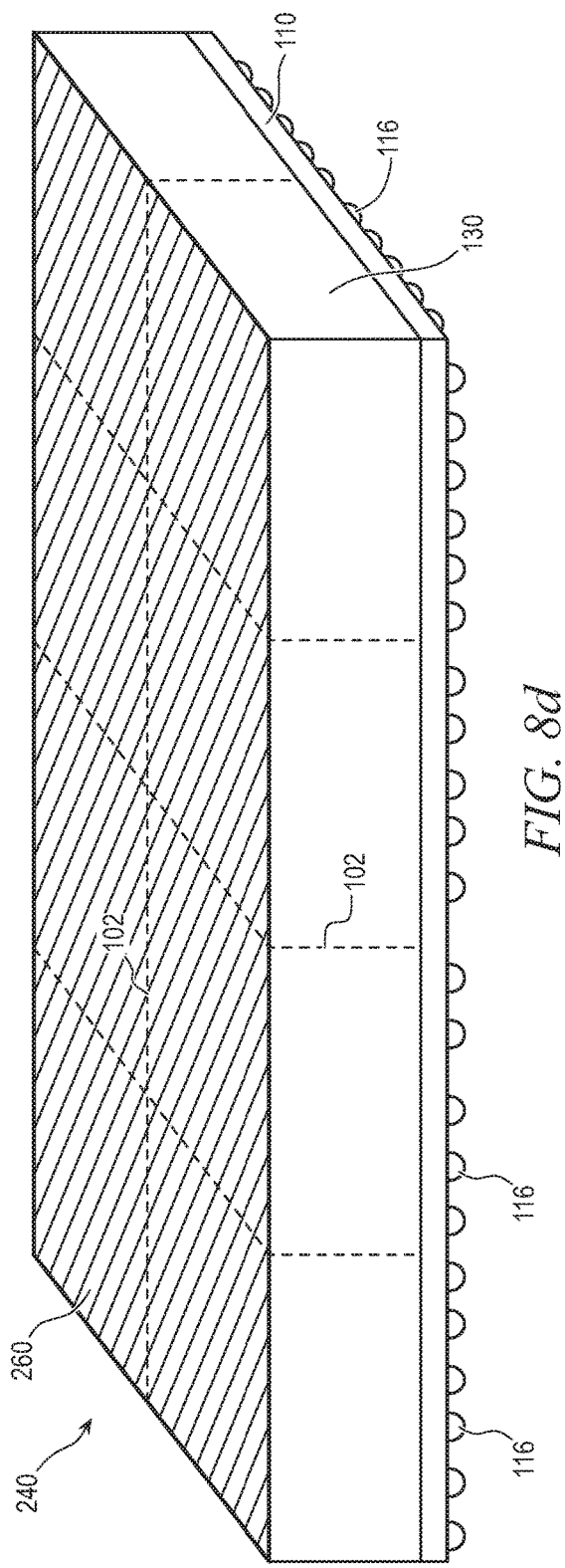

SEMICONDUCTOR DEVICE WITH PARTIAL EMI SHIELDING AND METHOD OF MAKING THE SAME

FIELD OF THE INVENTION

The present invention relates in general to semiconductor devices and, more particularly, to semiconductor devices, and methods of forming semiconductor devices, with partial shielding against electromagnetic interference (EMI).

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices commonly include some circuitry to process radio frequency (RF) signals. Recent technological advances allow for high speed digital and RF semiconductor packages integrated with small sizes, low heights, high clock frequencies, and good portability using system-in-package (SiP) technology. SiP devices include multiple semiconductor components, e.g., semiconductor die, semiconductor packages, integrated passive devices, and discrete active or passive electrical components, integrated together in a single semiconductor package.

FIG. 1 illustrates a prior art SiP device 30. SiP device 30 includes a plurality of components disposed on a PCB or other substrate 32. Substrate 32 includes one or more insulating layers 34 with conductive layers 36 formed over, between, and through insulating layers 34.

Semiconductor die 40 is integrated as part of SiP device 30. Semiconductor die 40 includes an active surface 42 with contact pads 44 formed over the active surface. Solder bumps 46 are used to electrically and mechanically couple contact pads 44 of semiconductor die 40 to conductive layer 36 of substrate 32. Semiconductor die 40 is electrically coupled to semiconductor package 50 through conductive layers 36.

Semiconductor package 50 includes semiconductor die 52 to provide active functionality. Semiconductor die 52 has contact pads 54 over an active surface of the semiconductor die. Semiconductor die 52 is disposed over a die pad of leadframe 56 and coupled to contacts or leads of the leadframe by bond wires 57. Semiconductor die 52, bond wires 57, and leadframe 56 are molded in encapsulant 58 prior to integration into SiP device 30. Once completed, semiconductor package 50 is mounted on substrate 32 with solder 59 used for mechanical and electrical coupling. In one embodiment, solder 59 is a solder paste printed onto substrate 32 prior to mounting of semiconductor package 50.

A second encapsulant 60 is deposited over semiconductor die 40, semiconductor package 50, and substrate 32 after integration to environmentally protect SiP device 30. Solder bumps 62 are disposed on the opposite side of substrate 32 from semiconductor die 40 and semiconductor package 50. Bumps 62 are subsequently used to mount SiP device 30 onto the substrate of a larger electronic device. SiP device 30 includes a plurality of semiconductor devices that operate together to achieve a desired electrical functionality.

Because of the high speed digital and RF circuits in SiP device 30, shielding from electromagnetic interference is important. Conformal EMI shielding has emerged as a preferred method to reduce electromagnetic interference (EMI). EMI from nearby devices hitting SiP device 30 can cause malfunctions within the SiP device's components. EMI from SiP device 30 may also cause malfunctions in nearby devices. FIG. 1 illustrates a conformal EMI shield 64. EMI shield 64 is a thin layer of metal formed by sputtering that is conformally coated over the top and side surfaces of SiP device 30 after encapsulant 60 is deposited. EMI shield 64 reduces the magnitude of EMI radiation entering and exiting SiP device 30 to reduce interference. In some embodiments, EMI shield 64 is coupled to ground through conductive layers 36 in substrate 32 that extend to the edge of the substrate.

EMI shield 64 provides a reduction in EMI interference. However, conformal coating EMI shield 64 over the entirety of SiP device 30 causes problems for devices or modules in the SiP device that need to act as a transceiver antenna. EMI shield 64 reduces the magnitude of all electromagnetic radiation, including radiation desired for communication or other purposes. To transmit and receive using an antenna, semiconductor die 40 or semiconductor package 50 must be coupled to a separate element of the electronic device with an antenna outside of EMI shield 64. However, having transceiver components integrated within a SiP device along with other components that benefit from EMI protection would allow further improvements in speed, size, and power requirements of electronic devices. Therefore, a need exists for partial EMI shielding of semiconductor packages.

BRIEF DESCRIPTION OF THE DRAWINGS

FIGS. 2a-2l illustrate a process of forming a SiP device with partial EMI shielding over the top and side surfaces of the SiP device;

FIGS. 3a-3f illustrate a process of forming a SiP device with partial EMI shielding over the top surface of the SiP device;

FIGS. 4a-4f illustrate various alternatives for forming EMI shielding over only a part of the SiP devices.

FIGS. 8a-8f illustrate forming partial EMI shielding with a metal lid or column surrounding protected components;

DETAILED DESCRIPTION OF THE DRAWINGS

Figure 1:
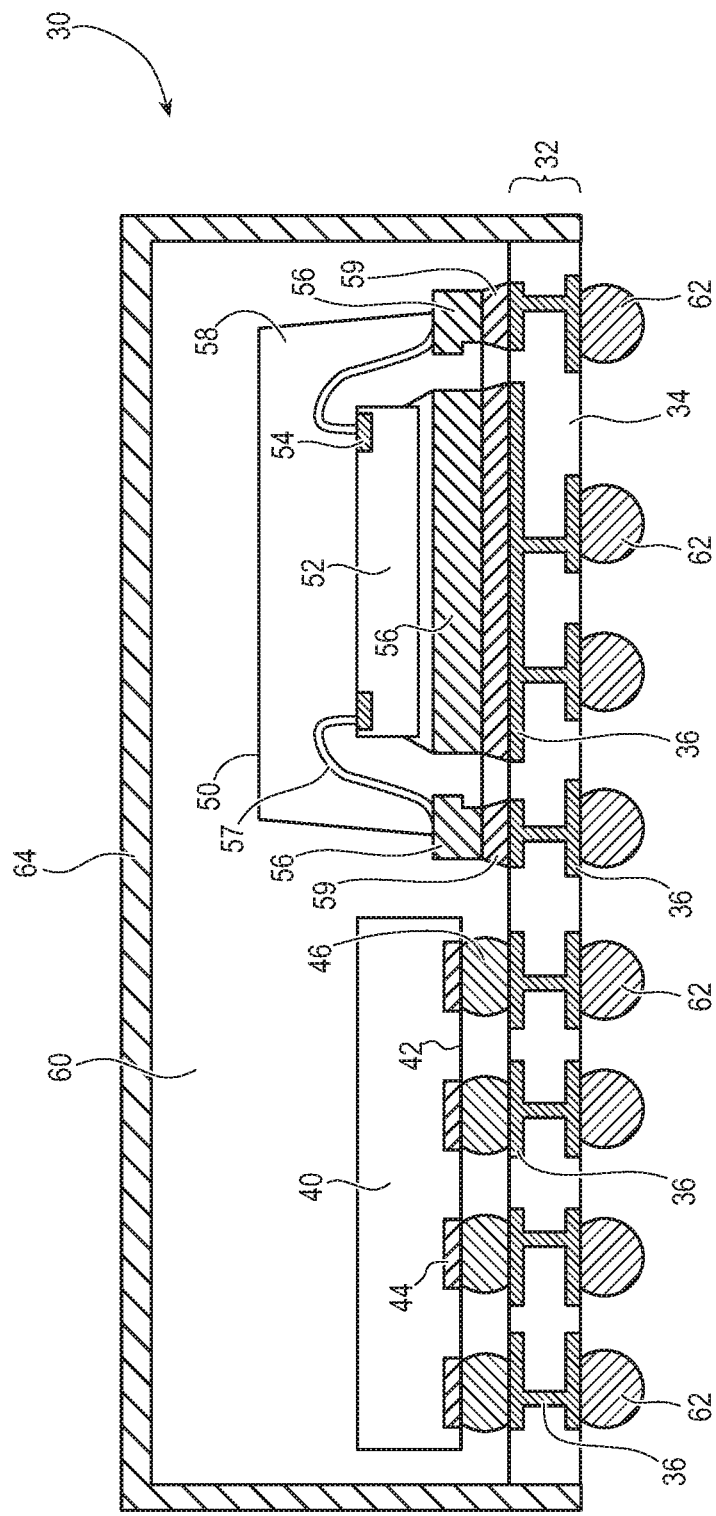
FIG. 1 illustrates a SiP device with a conformally applied EMI shielding layer.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

FIG. 2a is a cross-sectional view of a panel 100 of SiP devices separated by saw streets 102 prior to forming of a partial EMI shield and singulation into individual SiP devices. Two SiP devices are illustrated, but up to hundreds or thousands of SiP devices are commonly formed in a single panel. Panel 100 is formed over a substrate 110, similar to substrate 32 in the prior art. Substrate 110 includes one or more insulating layers 112 interleaved with one or more conductive layers 114. Insulating layer 112 is a core insulating board in one embodiment, with conductive layers 114 patterned over the top and bottom surfaces, e.g., a copper-clad laminate substrate. Conductive layers 114 also include conductive vias electrically coupled through insulating layers 112. Substrate 110 can include any number of conductive and insulating layers interleaved over each other. A solder mask layer can be formed over either side of substrate 110.

Solder bumps 116 are formed on contact pads of conductive layer 114 over the bottom surface of substrate 110. Bumps 116 are optionally formed at a later processing step. Other types of interconnect structures are used in other embodiments for integration of the SiP devices into an electronic device, such as stud bumps, conductive pins, land grid array (LGA) pads, or wire bonds.

Any suitable type of substrate or leadframe is used in other embodiments. In one embodiment, panel 100 is formed over a sacrificial substrate that is removed prior to completion of the SiP devices. Removing the sacrificial substrate exposes interconnect structures on the encapsulated devices for subsequent interconnect into the larger system.

Any components desired to implement the intended functionality of the SiP devices are mounted to or disposed over substrate 110 and electrically connected to conductive layers 114. FIG. 2a illustrates semiconductor package 50 and semiconductor die 124 mounted on substrate 110 as an example. Semiconductor die 124 is a transceiver device that uses antenna 128 to convert between an electromagnetic radiation signal sent or received over the airwaves and an electrical signal within the semiconductor die. The transceiver functionality of semiconductor die 124 will be facilitated by not having a conformal EMI shielding layer formed over antenna 128, which could block desirable signals. On the other hand, semiconductor package 50 is an example device that benefits from an EMI shielding layer.

In one embodiment, semiconductor die 124 is a radar device used for object detection in self-driving vehicles, and semiconductor package 50 includes memory and logic circuits to support the radar functionality. In other embodiments, any desired components can be incorporated into a SiP device. The components can include any combination of any type of semiconductor package, semiconductor die, integrated passive device, discrete active or passive components, or other electrical components.

The components in each SiP device, e.g., semiconductor die 124 and semiconductor package 50, are mounted on and connected to substrate 110 by a suitable interconnect structure, e.g., solder bumps 46, and then encapsulated. An encapsulant or molding compound 130 is deposited over semiconductor die 124, semiconductor package 50, and substrate 110 using a paste printing, compressive molding, transfer molding, liquid encapsulant molding, vacuum lamination, spin coating, or other suitable applicator. Encapsulant 130 can be polymer composite material, such as epoxy resin, epoxy acrylate, or any suitable polymer with or without filler. Encapsulant 130 is non-conductive, provides structural support, and environmentally protects the SiP devices from external elements and contaminants.

In FIG. 2b, a trench 140 is formed through each SiP device between semiconductor die 124 and semiconductor package 50. Trench 140 is formed by chemical etching with a photolithographic mask, laser ablation, saw cutting, reactive ion etching, or another suitable trenching process. In one embodiment, trench 140 extends continuously for an entire length of panel 100 into and out of the page of FIG. 2b. Trench 140 is shorter in other embodiments, e.g., only formed directly between semiconductor die 124 and semiconductor package 50 and not extending to the edges of the SiP devices. Trench 140 is formed completely through encapsulant 130 down to substrate 110. A portion of conductive layer 114 is exposed within trench 140. Conductive layer 114 can be patterned to include a strip extending for the length of trench 140 to reduce electrical resistance between the conductive layer and subsequently deposited conductive material.

Figure 2C:
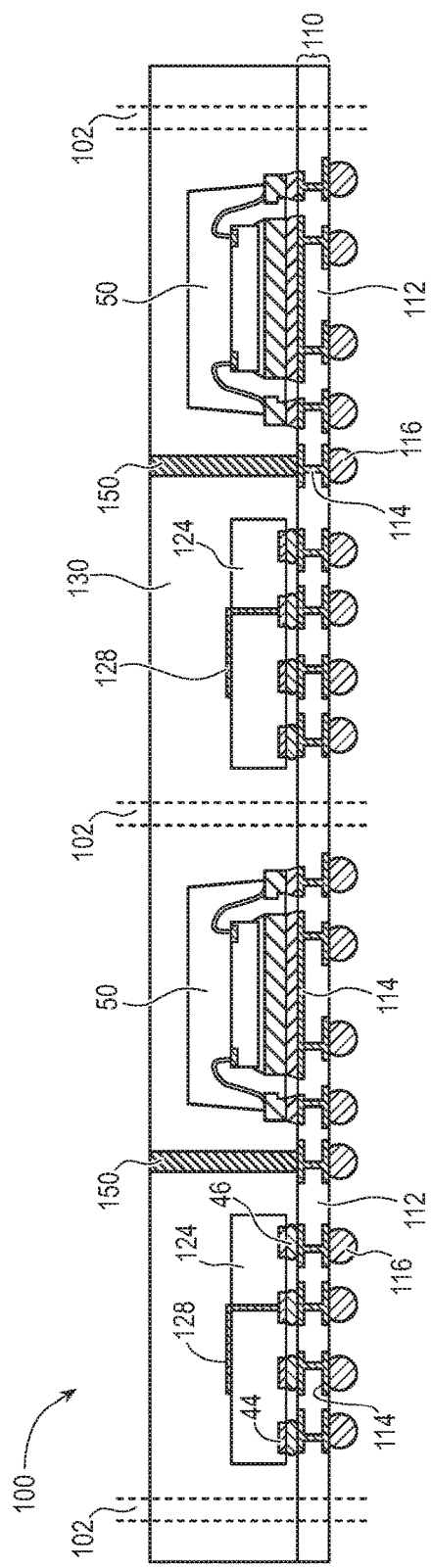

FIG. 2c illustrates a partial cross-section of panel 100. Trenches 140 are filled with conductive material to form a lid 150. Lid 150 is formed using any suitable metal deposition technique. Lid 150 can be formed by filling trench 140 with a conductive ink or paste, or plating conductive material within the trench. In other embodiments, lid 150 is pre-formed and inserted into trench 140. Lid 150 is a metal layer extending between semiconductor die 124 and package 50 to reduce the magnitude of EMI directly radiating from antenna 128 toward package 50, or vice versa. In some embodiments, lid 150 is electrically coupled to a ground node through conductive layer 114 and bumps 116 to aid in EMI blocking capability. In other embodiments, lid 150 reduces EMI without a connection to conductive layer 114 or a ground node.

Figure 2D:
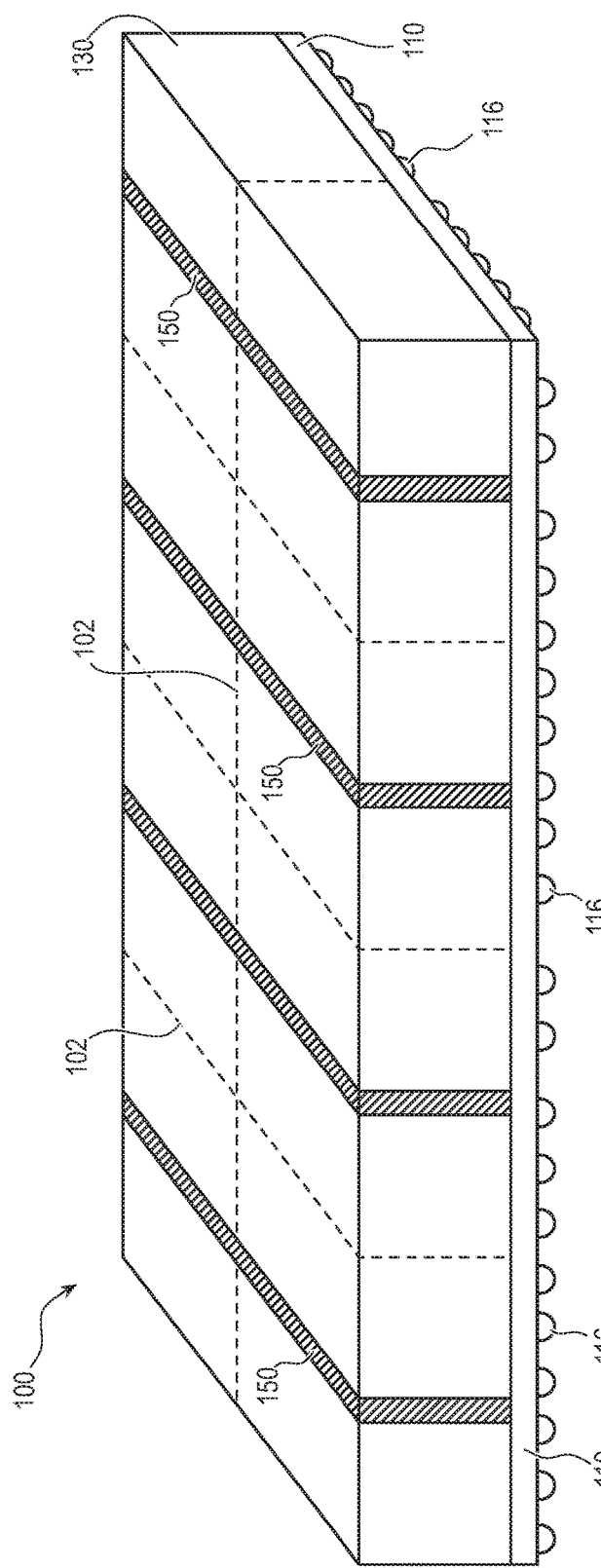

FIG. 2d illustrates a perspective view of a portion of panel 100 having eight SiP devices formed at once. Each of the eight SiP devices includes a lid 150 splitting the device into two distinct regions. Lid 150 is illustrated as being halfway between adjacent saw streets 102. However, the lid can form any desired size and shape of partition for EMI shielding. Each column or row of devices shares a lid 150 in common, as trench 140 and lid 150 are formed for an entire width or length of panel 100. In other embodiments, each device has a separate lid 150 that may or may not extend to saw streets 102.

Figure 2E:
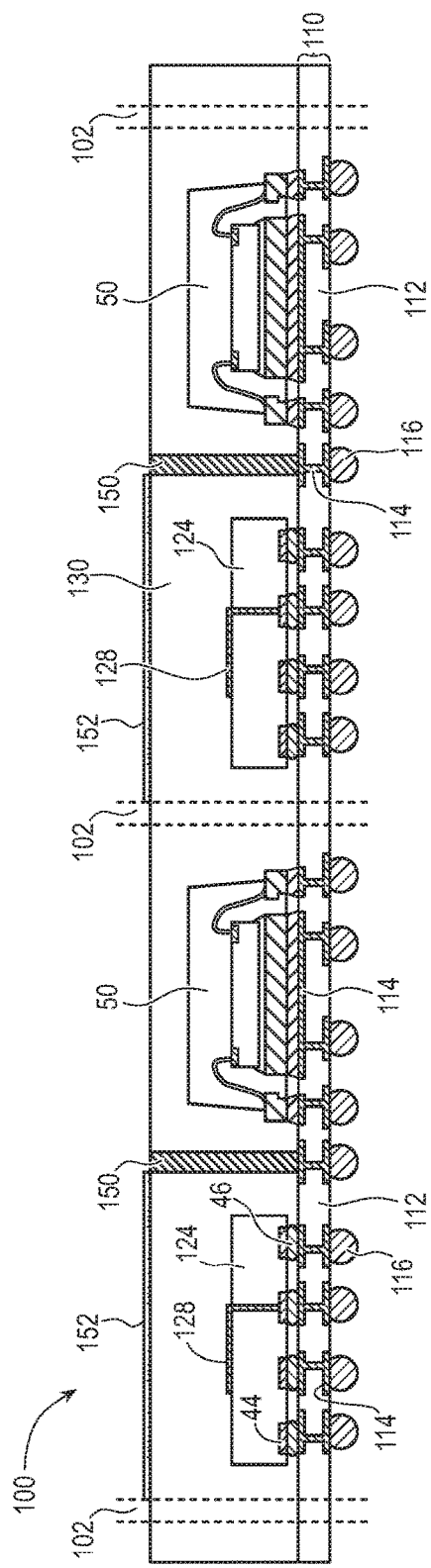
Figure 2F:
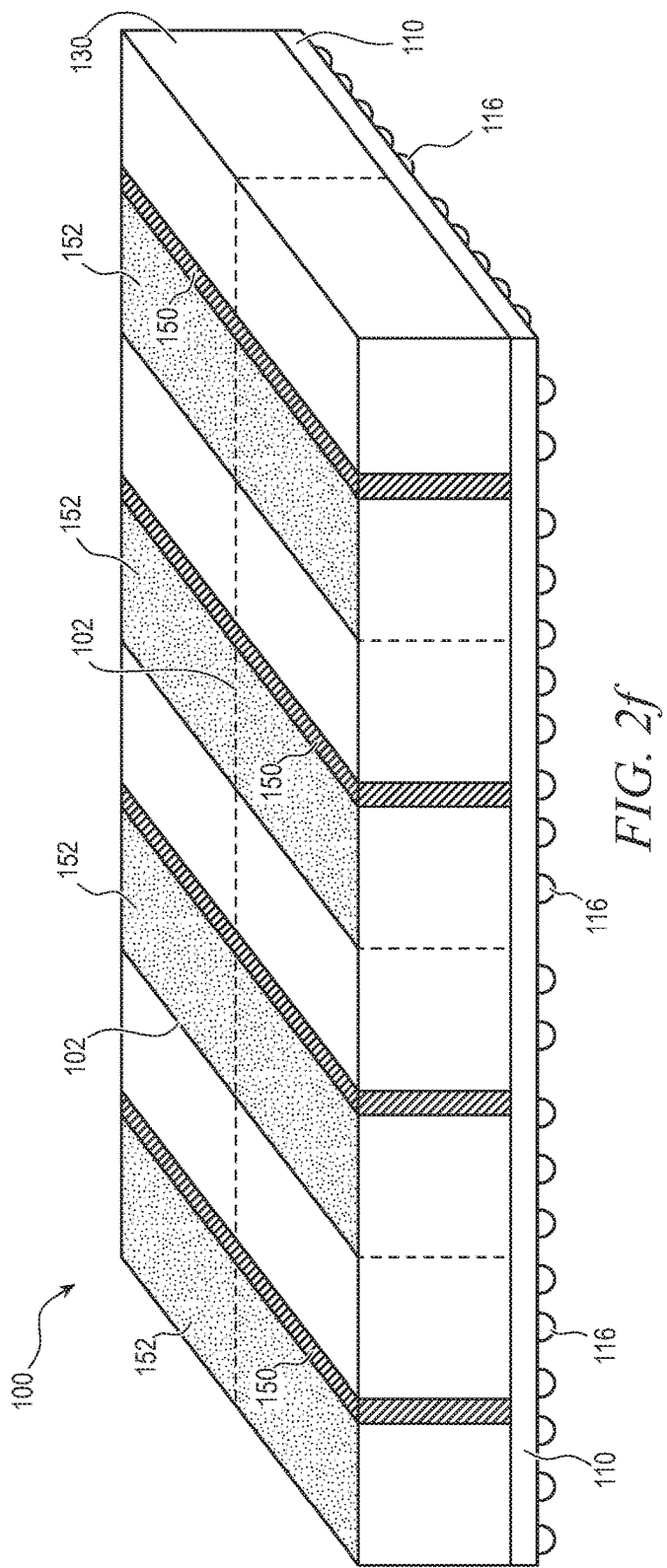

FIGS. 2e and 2f show a cross-section and perspective view, respectively, of panel 100 with film 152 disposed over one half of each of the SiP devices. Film 152 is an adhesive tape, metal foil film, metal foil tape, polyimide film, or any other suitable film mask. A metal, plastic, or silicone mask is used for film 152 in other embodiments. Any of the film 152 options can include adhesive to provide a mechanical attachment of the film to encapsulant 130. The adhesive can be ultraviolet (UV) release, thermal release, or otherwise configured to allow for convenient removal of film 152. Film 152 can also be any suitable insulating, passivation, or photoresist layer deposited by any appropriate thin film deposition technique. Film 152 is applied over the top surface of panel 100 directly on encapsulant 130 and runs in parallel with lids 150. Lids 150 remain exposed from film 152 so that a subsequently applied shielding layer will contact the lids to form a continuous EMI shield.

Film 152 is applied in strips over semiconductor die 124. Film 152 extends along the entire length of panel 100 in parallel with lid 150, and perpendicularly across panel 100 from each lid to an adjacent saw street 102. Therefore, the side of each SiP device with semiconductor die 124 is fully covered by film 152. In other embodiments, only a portion of the side with semiconductor die 124 is covered by film 152. Film 152 could be applied as a small patch of film directly over each semiconductor die 124 without extending to lid 150 or any saw street 102.

Figure 2G:
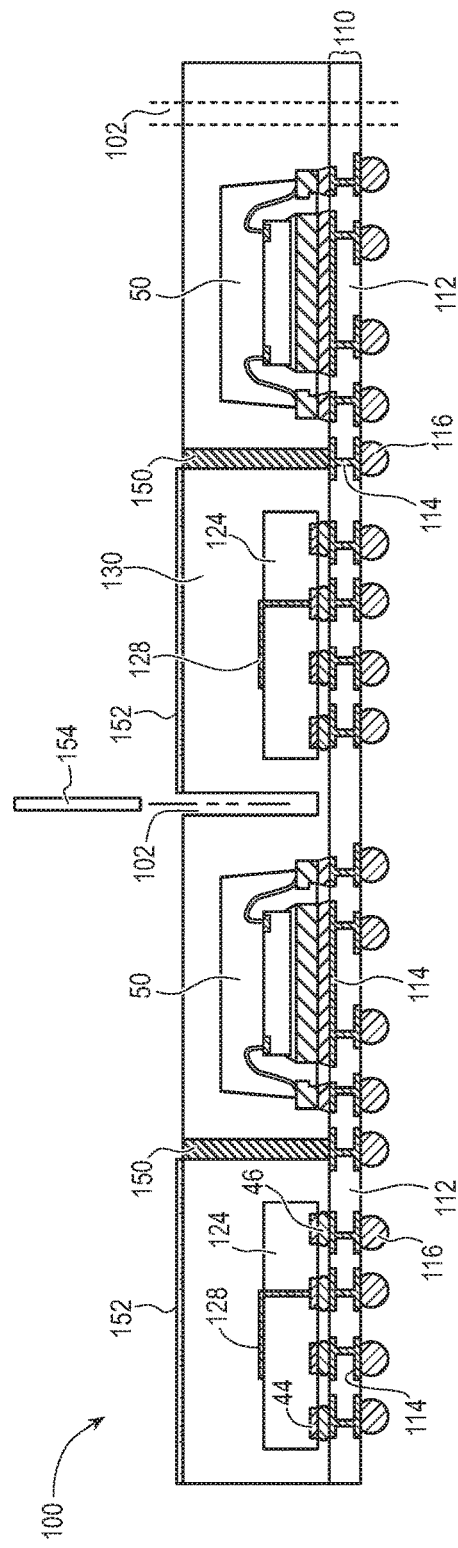
Figure 2H:
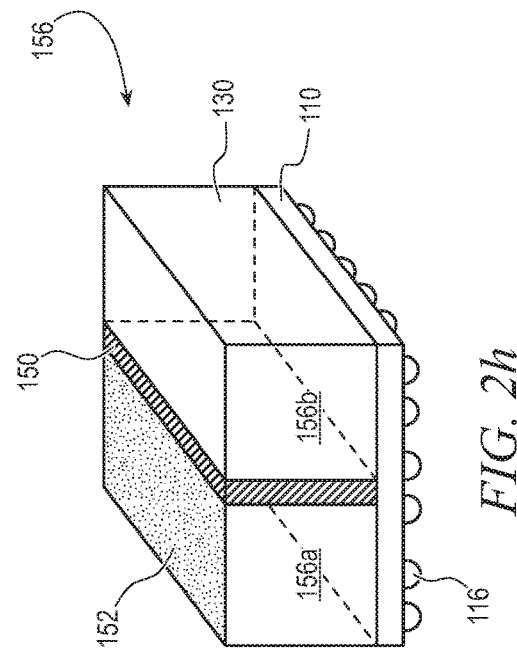

In FIG. 2g, panel 100 is singulated at saw streets 102 using a saw blade, water jet, or laser cutting tool 154 to cut through encapsulant 130 and substrate 110 and separate each of the devices into an individual SiP device 156 as shown in FIG. 2h. Each SiP device 156 is split into two sides by lid 150. Open side 156a has film 152 over the open side, and shielded side 156b is without the film. Open side 156a is referred to as the open side because film 152 operates as a mask when forming a subsequent shielding layer to leave the open side at least partially free from the shielding layer. Any devices that desirably emit or receive electromagnetic radiation, e.g., semiconductor die 124, are placed within open side 156a under film 152. Any devices that are to be protected from EMI by shielding, e.g., semiconductor package 50, are placed within shielded side 156b. The devices on open side 156a and shielded side 156b can be electrically coupled to each other across the boundary created by lid 150 through conductive layers 114, or by an underlying substrate of a larger electronic device that SiP device 156 is integrated into.

In FIGS. 2i and 2j, which show two different views of the same processing step, conformal shielding layer 160 is formed over SiP device 156. Shielding layer 160 is formed by spray coating, plating, sputtering, or any other suitable metal deposition process. Shielding layer 160 can be formed from copper, aluminum, iron, or any other suitable material for EMI shielding. In some embodiments, panel 100 is placed on a carrier with an optional thermal release or interface layer during singulation in FIG. 2g. The singulated SiP devices 156 remain on the same carrier for application of shielding layer 160. Therefore, the space between adjacent SiP devices 156 during forming of shielding layer 160 is equivalent to the width of the saw kerf of cutting tool 154. However, the thickness of shielding layer 160 is low enough that the shielding layers of adjacent SiP devices 156 do not touch and the packages remain singulated on the carrier. In other embodiments, SiP devices 156 are disposed on a separate carrier after singulation and prior to forming shielding layer 160.

Shielding layer 160 completely covers every exposed surface of SiP device 156, including the top and all four side surfaces. All exposed surfaces of encapsulant 130 are coated in the conductive material in forming shielding layer 160, as is film 152. The bottom surface of SiP device 156 with substrate 110 and bumps 116 is normally not covered by shielding layer 160, either because the sputtering method is from the top-down and only covers sideways or upward facing surfaces, or because an interface layer on the carrier fully covers the bottom surface and operates as a sort of mask.

After shielding layer 160 is deposited, film 152 is removed as shown in FIGS. 2k and 2l, which are two different views of the same processing step. Removing film 152 also removes the portion of shielding layer 160 on the film and exposes encapsulant 130 over open side 156a of the package.

SiP device 156 includes shielded side 156b with package 50 that has EMI shielding completely surrounding the shielded side. Shielding layer 160 and lid 150 in combination extend completely and continuously around the side of and over the top of shielded side 156b. Semiconductor package 50 remains electrically coupled to semiconductor die 124, other devices of open side 156a, and the outside world through conductive layer 114 and bumps 116.

Open side 156a is completely surrounded by EMI shielding around the sides of the open side, similar to shielded side 156b. However, the top of open side 156a is devoid of shielding layer 160 due to film 152 having been used as a mask. The opening in shielding layer 160 over semiconductor die 124 allows antenna 128 to send and receive electromagnetic signals without the signals being significantly dampened or blocked by the shielding layer. Lid 150 allows shielding layer 160 to have an opening for antenna 128 without compromising EMI shielding of semiconductor package 50 because the semiconductor package in shielded side 156b is still fully surrounded by EMI shielding.

Figure 3C:
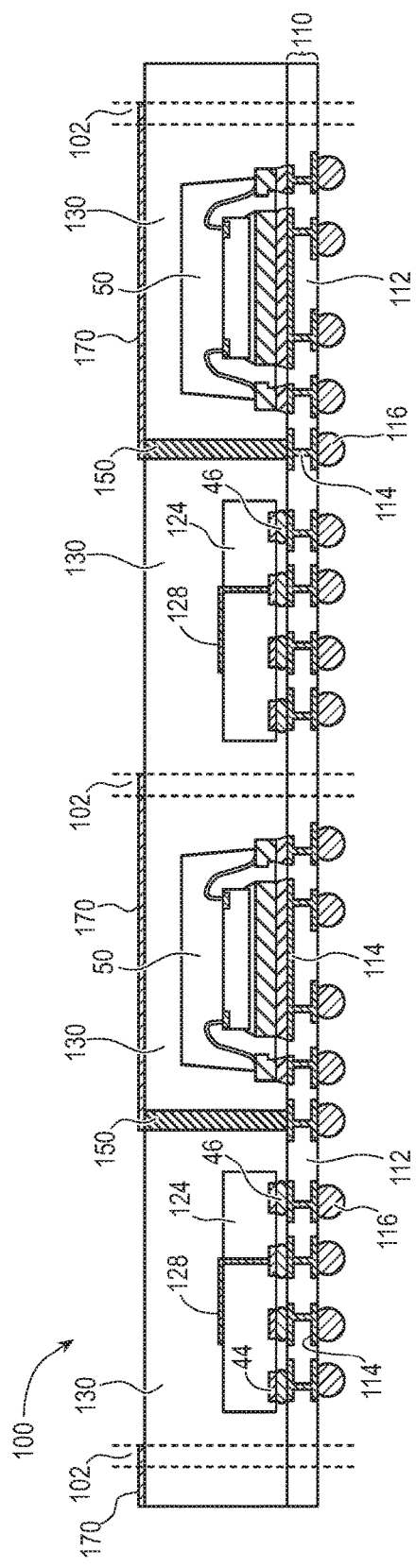

FIGS. 3a-3f illustrate an alternative method for forming a semiconductor package with partial EMI shielding. Continuing from FIG. 2f, FIGS. 3a and 3b show shielding layer 170 formed over panel 100 after applying film 152 but before singulating the panel. Shielding layer 170 is formed directly on a top surface of lid 150 to form a continuous shielding layer, just as with shielding layer 160. Unlike shielding layer 160, shielding layer 170 does not cover the side surfaces of the final packages, because layer 170 is formed at the panel level and not at the unit level. Saw streets 102 remain occupied by encapsulant 130 that blocks shielding layer 170 from forming on the side surfaces of the individual devices. FIGS. 3a and 3b only illustrate a portion of panel 100. The non-illustrated portions of panel 100 result in shielding layer 170 not forming over the visible side surfaces in FIGS. 3a and 3b. Shielding layer 170 is formed by any of the methods, and from any of the materials, mentioned above for shielding layer 160.

Figure 3D:
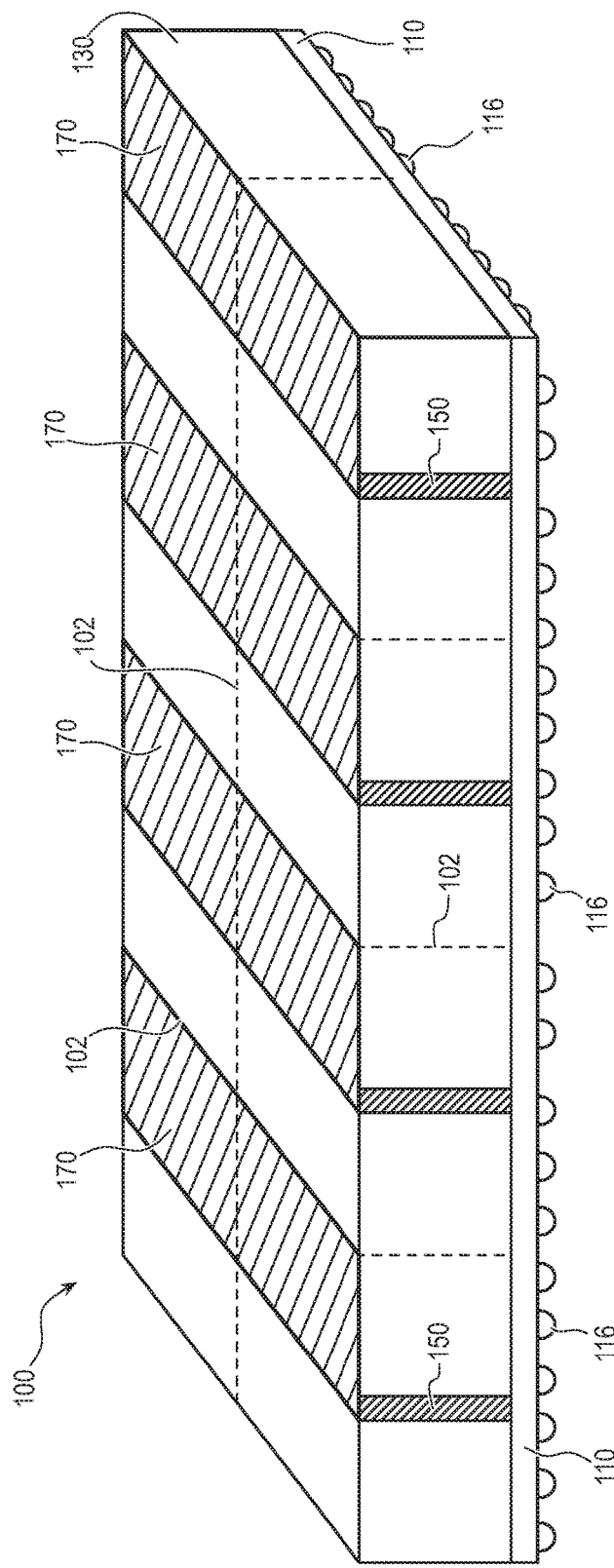
Figure 3E:
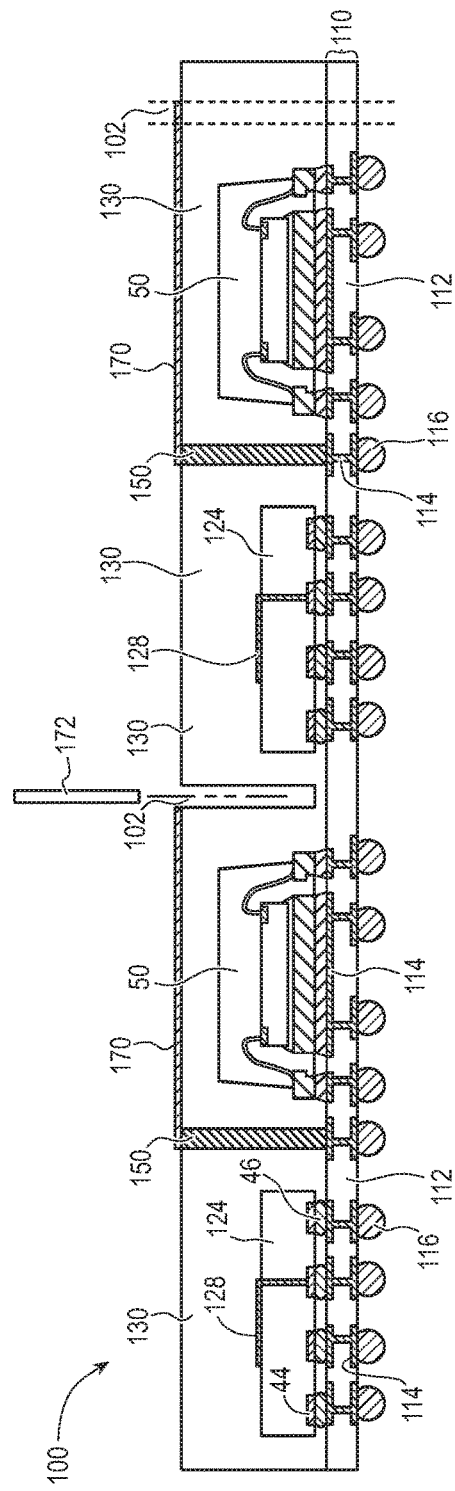
Figure 3F:
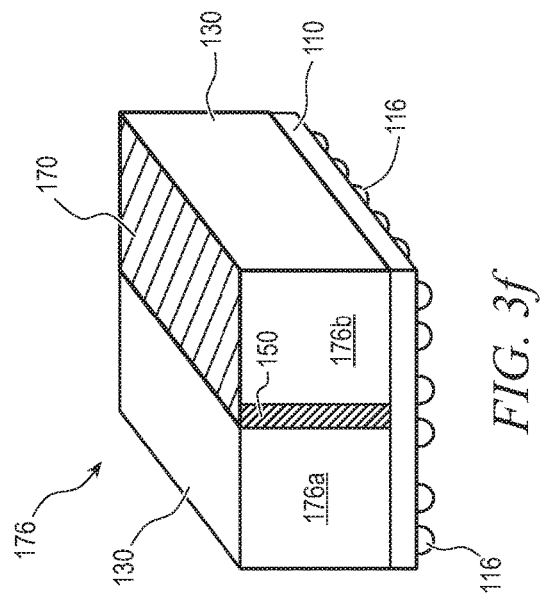

In FIGS. 3c and 3d, film 152 is removed from panel 100, which also removes the portions of shielding layer 170 over semiconductor die 124. FIG. 3e shows panel 100 being singulated by cutting tool 172 after formation of shielding layer 170, rather than prior to formation of shielding layer 160 as above. Singulation results in a SiP device 176 as shown in FIG. 3f. SiP device 176 includes lid 150 to protect shielded side 176b from radiation coming directly from antenna 128, or other devices in open side 176a. Shielding layer 170 protects shielded side 176b from radiation that is directed at SiP device 176 from above.

While shielded side 176b is not fully protected on all sides as with shielding layer 160, the partial shielding of SiP device 176 is useful in embodiments where the main concern is radiation from open side 176a, and from above. For instance, the electronic device with SiP device 176 may provide adequate shielding for the sides of the SiP device, but does not fully protect the top because of the desire to have semiconductor die 124 send and receive signals. As another example, the main EMI concern for package 50 may be radar or similar signals broadcast by antenna 128 that reflect and are then received by the antenna. Such reflected signals will be received primarily from above, and sufficiently blocked by shielding layer 170.

FIGS. 4a-4f illustrate various ways to singulate panel 100 prior to applying film 152 and then form partial shielding.

Continuing from FIGS. 2c and 2d, panel 100 is cut along saw streets 102 using cutting tool 178 into a plurality of SiP devices 180, shown in FIG. 4b, without film and without any shielding layers formed over the top surface. SiP devices 180 do have lid 150 splitting the package into an open side 180a and a shielded side 180b.

Figure 4C:
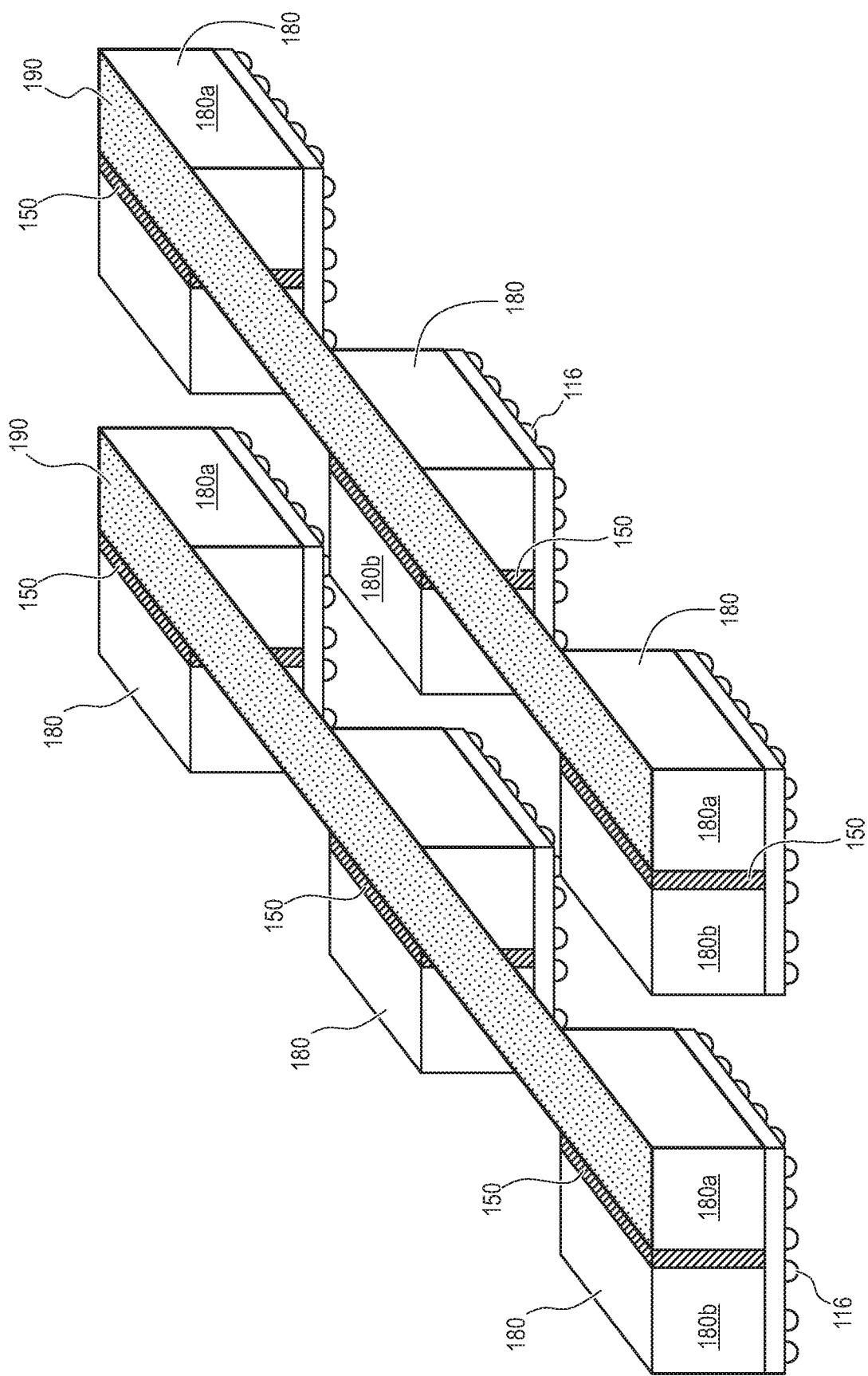

In FIG. 4c, a plurality of SiP devices 180 are disposed on a suitable substrate or carrier in rows with the open sides 180a of each package aligned with each other. The packages can be oriented in any direction, i.e., the packages of one row may be oriented with open sides 180a toward the left, while another row has the open sides oriented to the right, or the packages within a row can be oriented in different directions if desired, as long as the open sides 180a are aligned for application of film 190 as a length of tape or other strip.

Once SiP devices 180 are disposed with open sides 180a aligned, a film 190 is applied over the open sides with each row sharing a strip of film in common. Film 190 is similar to film 152 above, but applied at the unit level rather than on panel 100. One piece of film 190 covers an entire row of open sides 180a.

A shielding layer can be applied while SiP devices 180 are in the state as shown in FIG. 4c. Depending on the plating method used, the final shielding layer may look like shielding layer 160 in FIG. 2l once film 190 is removed, with all sides fully covered, or film 190 may operate as a shadow mask and partially block the side surfaces from being covered.

Figure 4D:
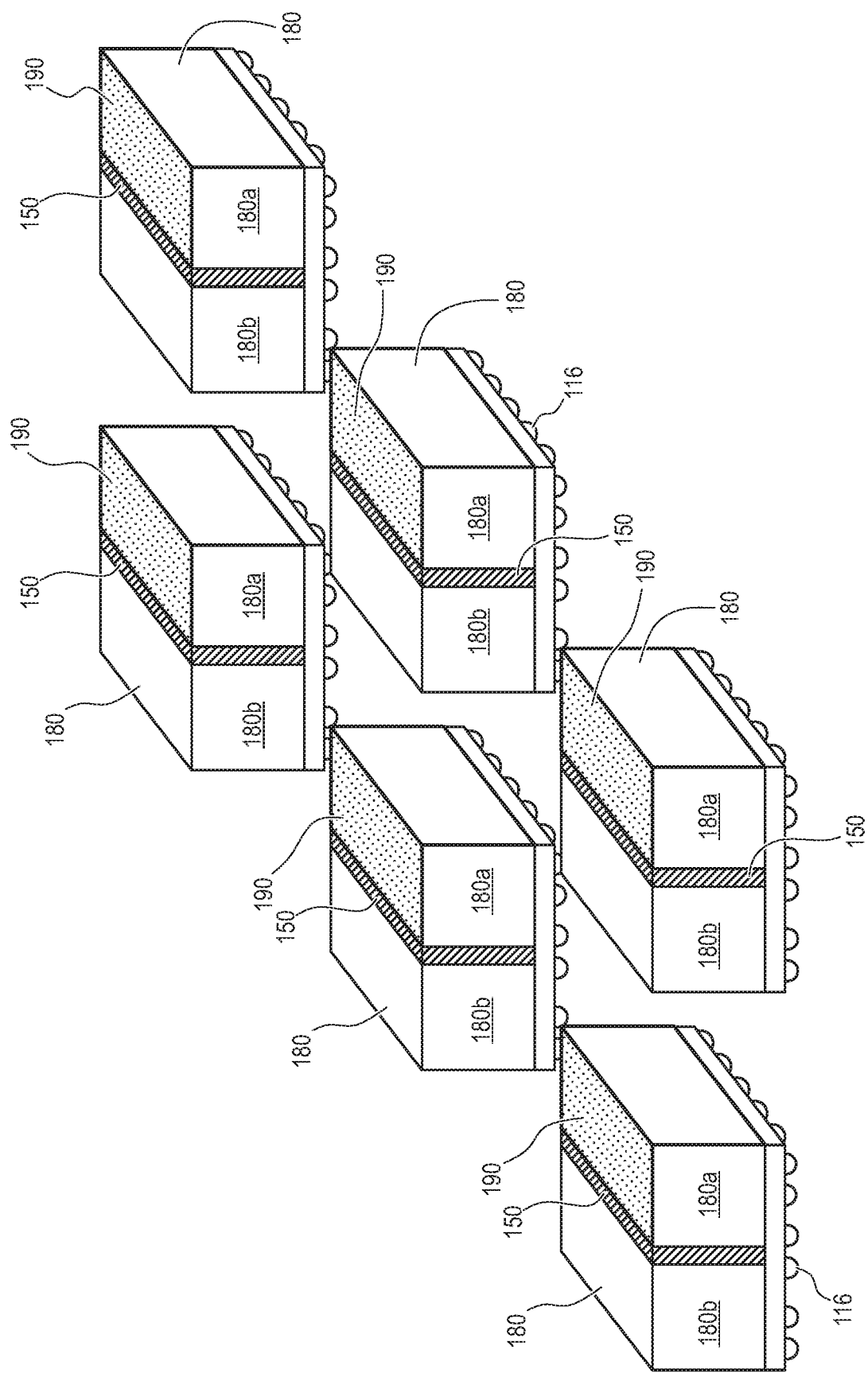

Alternatively, a laser or other cutting tool can be used to remove film 190 between SiP devices 180, as shown in FIG. 4d, prior to applying a shielding layer. Film 190 could also be applied as separate pieces on each SiP device 180 to reach the state shown in FIG. 4d directly without applying the film as a strip of tape across an entire row of devices first as in FIG. 4c. The film 190 pieces can fully cover open side 180a as shown in FIG. 4d or could be smaller pieces that only partially cover the open side. When film 190 is applied as individual pieces on each SiP device 180, open sides 180a may not be aligned. Plating of a shielding layer results in an end device that looks very similar to FIG. 2l, with only the top surface of open side 180a devoid of the shielding layer due to the presence of film 190. Film 190 leaves the top of lid 150 exposed so that the shielding layer forms directly on the lid to create a continuous EMI shield.

Figure 4E:
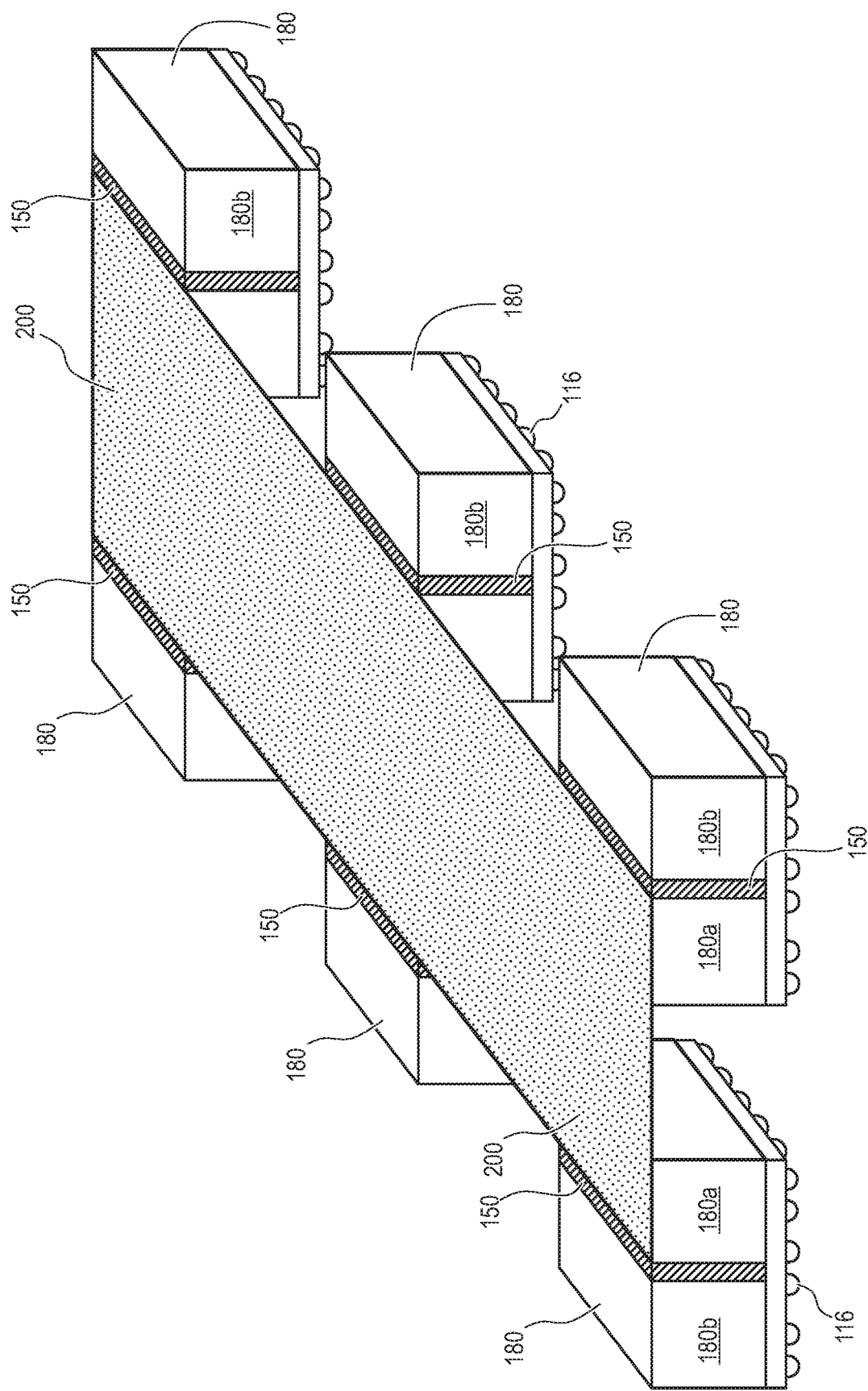

FIG. 4e shows using film 200, which is similar to film 152 and 190 above but is formed as a wider strip that can cover open sides 180a of two rows of packages. Each row of SiP devices 180 is oriented in the opposite direction from adjacent rows so that devices in one row have open sides 180a that face open sides 180a of another row. Film 200 is wide enough to cover open sides 180a of two rows with the open sides of the rows oriented toward each other. A shielding layer can be plated with film 200 configured as shown in FIG. 4e, in which case the side surfaces of open side 180a may remain devoid of shielding.

Figure 4F:
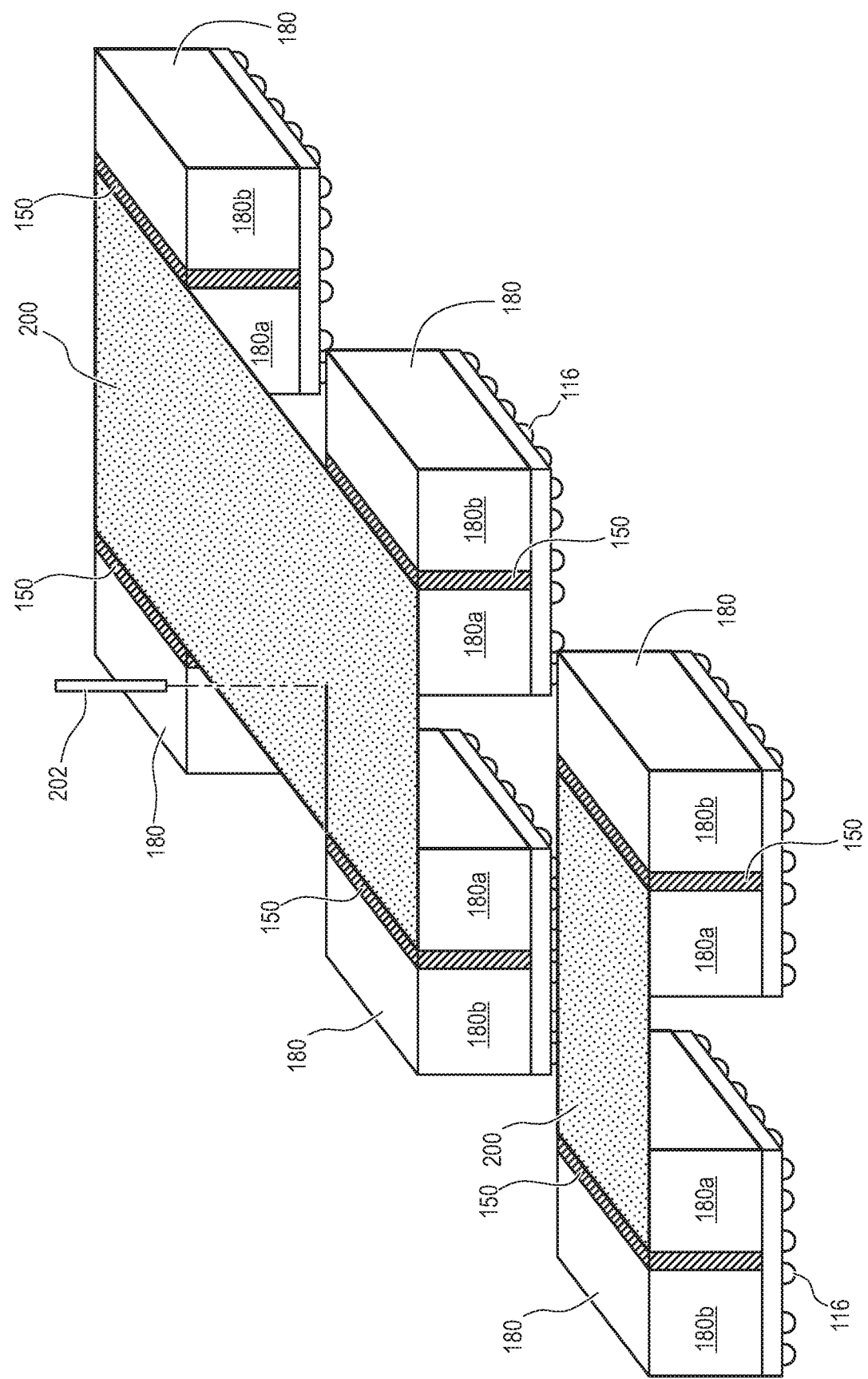

Alternatively, a cutting tool 202 can be used to remove excess film 200 between devices as shown in FIG. 4f. Film 200 remains extending between corresponding SiP devices 180 in adjacent rows. Film 200 may protect the side surfaces of SiP devices 180 that face each other under the film while allowing the side surfaces of open side 180a that face toward and away from the viewer to be covered in the shielding layer. Cutting tool 202 can also be used to remove the portion of film 200 between the directly adjacent devices with open sides 180a facing each other. Film 200 is applied directly in the configuration shown in FIG. 4f in other embodiments, i.e., as individual pieces each extending across two adjacent devices without having to cut after applying film 200.

Figure 5A:
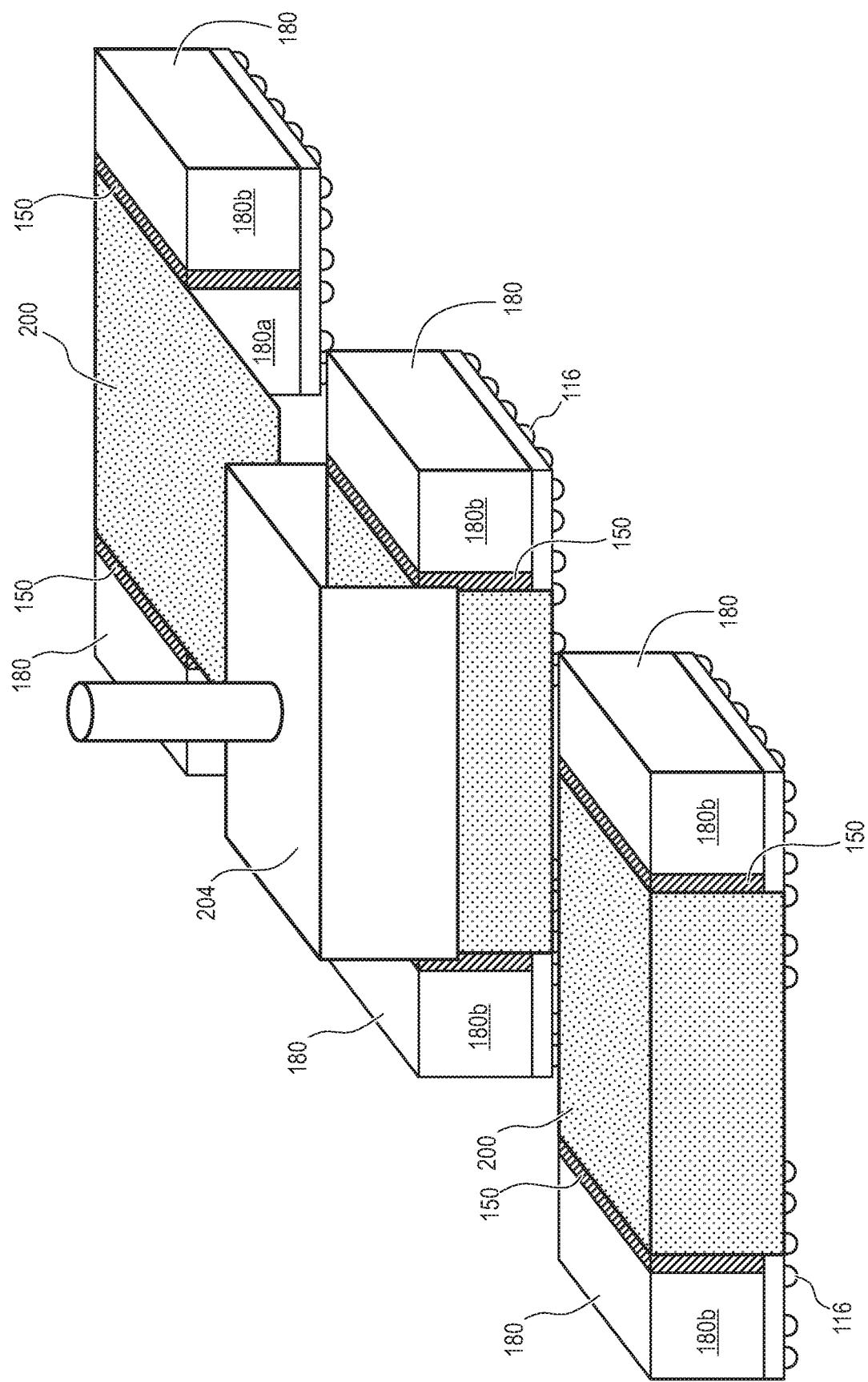
FIGS. 5a-5c illustrate using a jig to apply a film mask to side surfaces of the SiP devices.
Figure 5B:
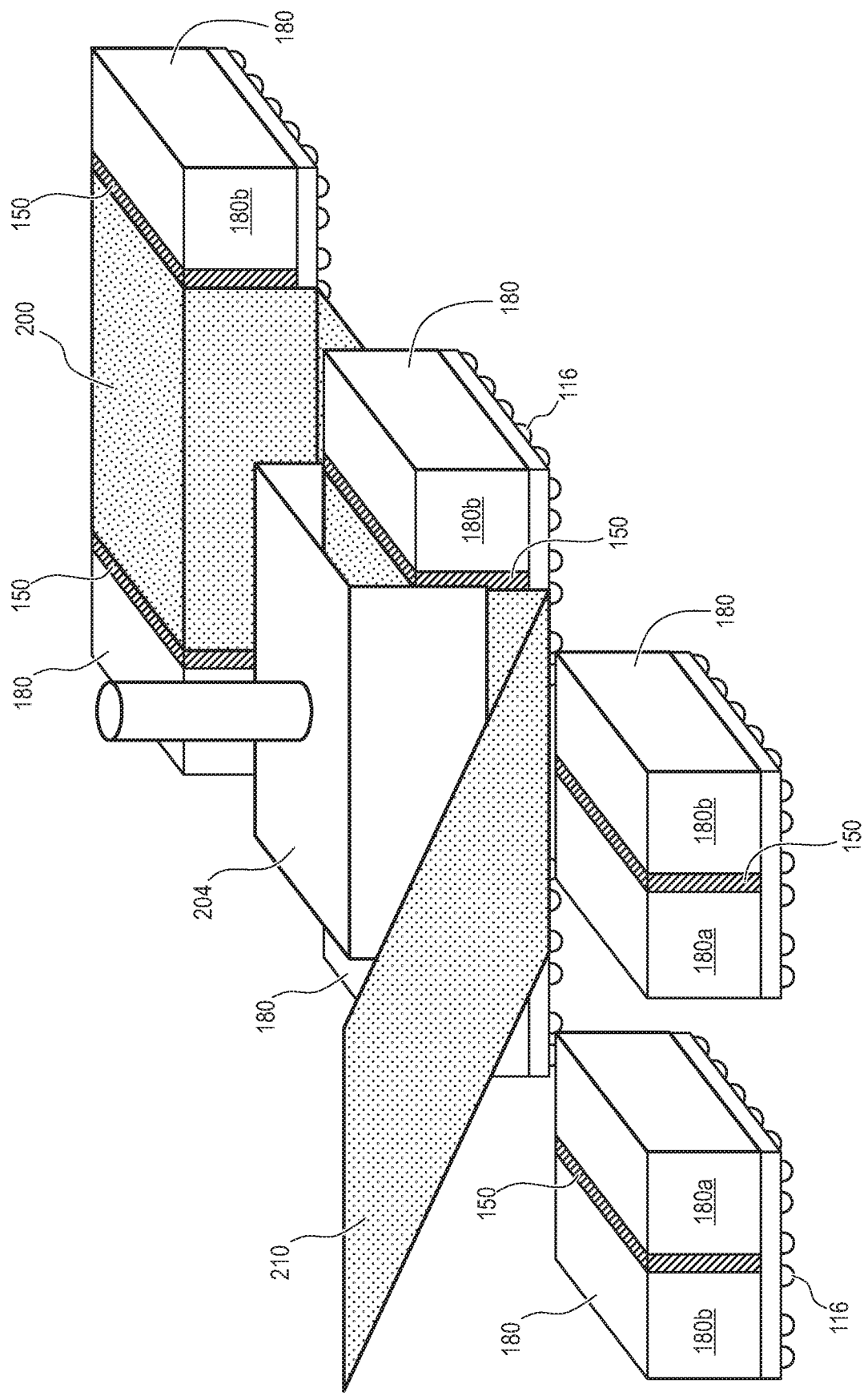
Figure 5C:
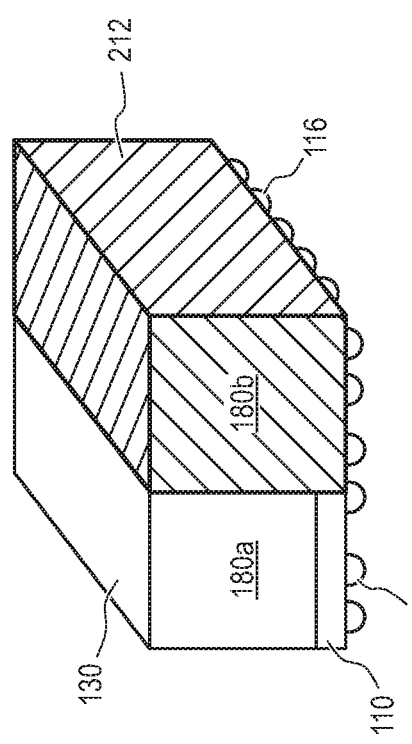

FIGS. 5a-5c illustrate using a jig to apply film 200 to SiP devices 180. One option, continuing from FIG. 4e, is to cut film 200 half-way between each pair of devices and then use jig 204 to press film 200 down onto the side surfaces of SiP devices 180, as shown in FIG. 5a. FIG. 5b illustrates using jig 204 to press film 200 down onto SiP devices 180 in pairs while the film is being applied in the first place. Film 200 stays as an uncut strip. Film 200 includes a tail 210 coming off a spool or other source of the film. Tail 210 is kept relatively taut and under control by the processing equipment. The source of film 200 is moved from one pair of devices to the next while jig 204 presses down the film onto each pair of the devices.

Once film 200 is pressed over each SiP device 180 by jig 204, shielding layer 212 is deposited over the packages as shown in FIG. 5c. Film 200 protects the top and all three side surfaces of open side 180a, so that the open side has no shielding layer 212 on any outer surface of SiP device 180. Film 200 did not extend over shielded side 180b, so the shielded side has shielding layer 212 over all three external side surfaces. As in the other embodiments above, lid 150 covers the fourth side surface of shielded side 180b to give the shielded side an EMI shield that extends continuously over all side surfaces and the top surface.

Figure 6:
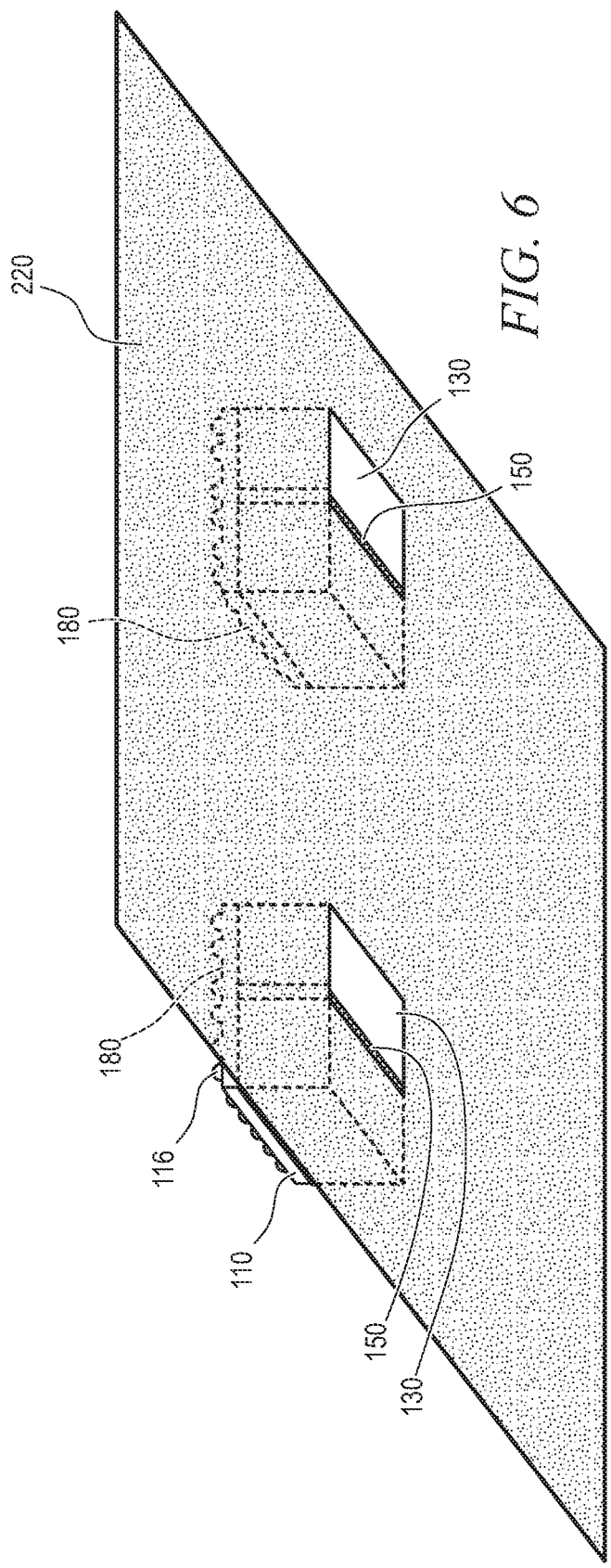
FIG. 6 illustrates mounting SiP devices to a film sheet with openings in the sheet to form partial EMI shielding.

FIG. 6 illustrates a film 220 used to mask a plurality of SiP devices 180. Film 220 includes openings or pockets that correspond to the top of shielded side 180b. SiP devices 180 are flip loaded onto film 220 so that the top of lid 150 and shielded side 180b is exposed through the film opening. Film 220 can be any suitable size and accommodate any number of SiP devices 180. Openings are formed in film 220 in any desired location and orientation to accommodate the desired number of packages. Alternatively, openings can be formed through film 220 after mounting SiP devices 180 onto the film using laser ablation or another suitable process.

A shielding layer is plated onto SiP devices 180 through the openings in film 220. The shielding layer is limited to only the top surfaces of lid 150 and shielded side 180b, as shown in FIG. 3f, if the opening is the same size are smaller than those surfaces. In other embodiments, the openings through film 220 are large enough to allow side surfaces of shielded side 180b to be plated. Film 220 is flipped over once SiP devices 180 are mounted in some embodiments so that sputtering of the shielding layer occurs from above.

Figure 7B:
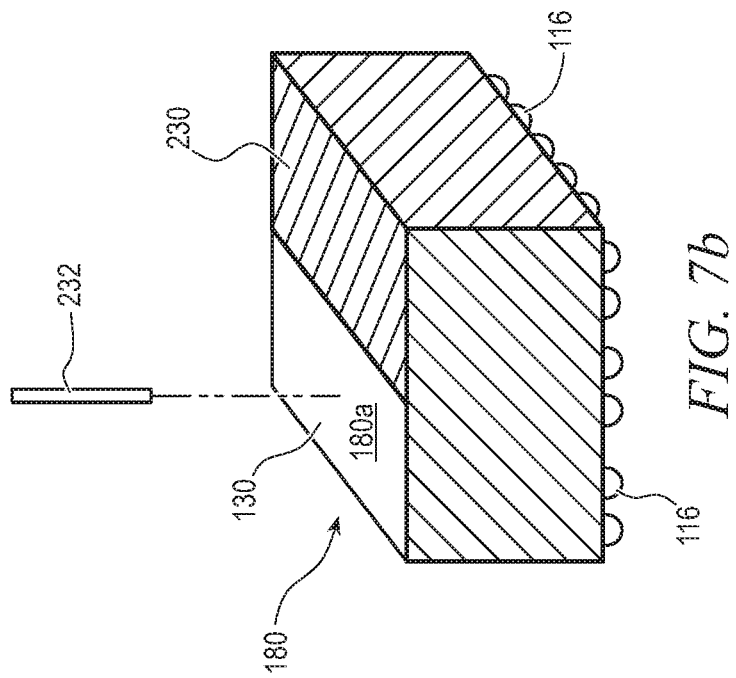
FIGS. 7a and 7b illustrate using laser ablation to remove a portion of an EMI shielding layer.
Figure 7A:
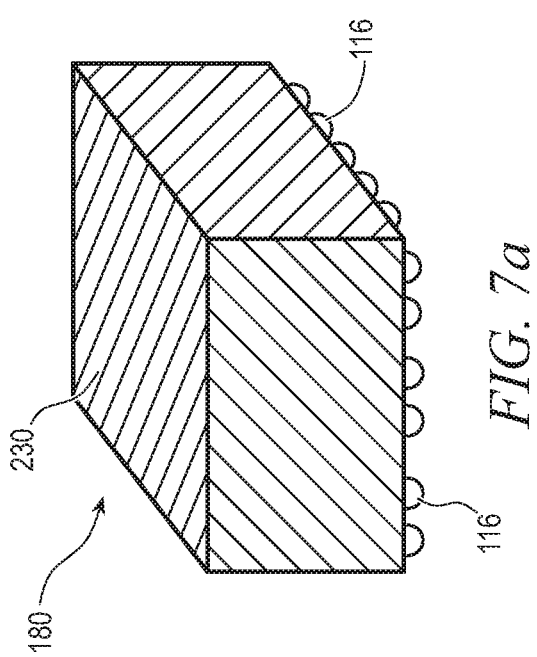

FIGS. 7a-7b illustrate using laser ablation to remove a portion of a shielding layer rather than using a film mask. In FIG. 7a, SiP device 180 is totally covered on the top and all side surfaces by a shielding layer 230, similar to FIG. 2j. However, unlike FIG. 2j, there is no film mask under shielding layer 230. Shielding layer 230 over open side 180a is removed by laser ablation with laser 232 in FIG. 7b. Shielding layer 230 can be completely or partially removed over open side 180a. Laser ablation can also be used to remove shielding layer 230 over some or all of the side surfaces of open side 180a. Shielding layer 230 remains extending on top of lid 150 so that shielded side 180b is fully and continuously encompassed by EMI shielding on the top and sides.

Figure 8E:
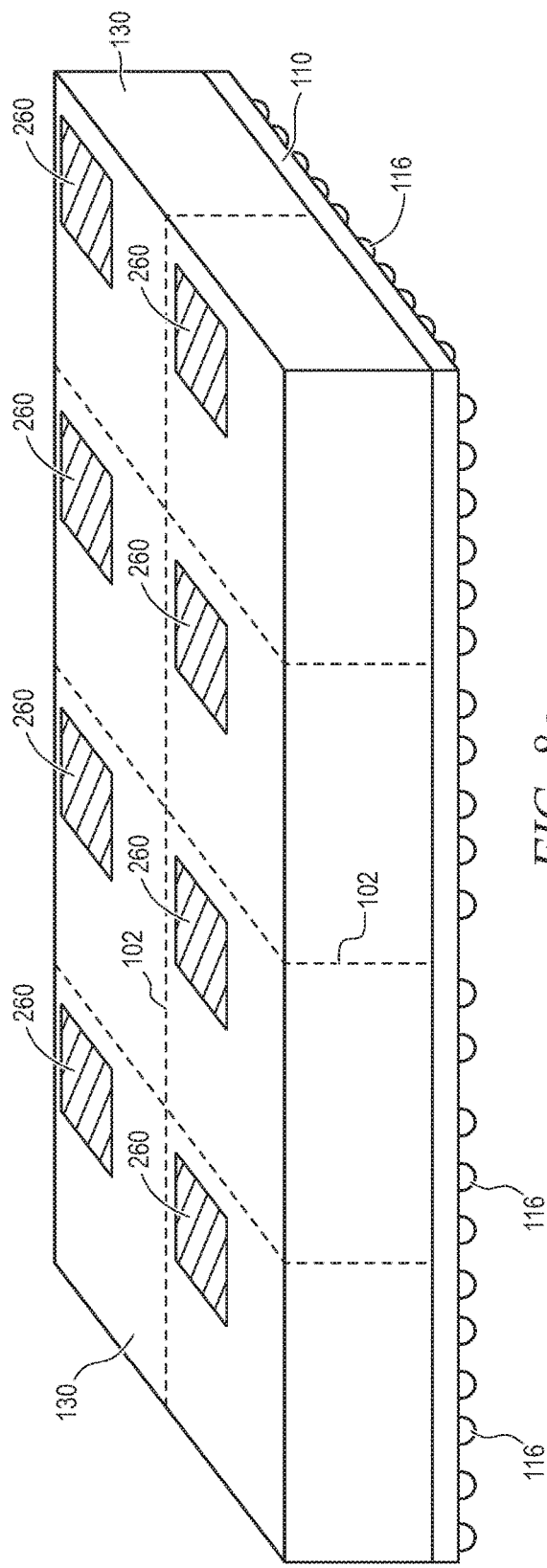

FIGS. 8a-8f illustrate forming SiP devices with a lid surrounding the components to be protected from EMI, rather than only splitting the SiP device into two sections as with lid 150 above. FIG. 8a begins illustrating the manufacturing process with a panel 240 in a similar state as shown in FIG. 2b. Some components that benefit from EMI protection, e.g., package 50, have been disposed on substrate 110 along with other components, e.g., semiconductor die 124, that utilize EMI radiation for their intended functionality. Rather than forming trench 140 between the two as in FIG. 2b, FIG. 8a shows a trench 242 formed completely around each semiconductor package 50. Trench 242 is otherwise similar to trench 140, and extends down to substrate 110 to expose contact pads or a conductive layer of the substrate. Trench 242 can be any suitable shape, not just square or rectangle, and any suitable size, including surrounding an entire side of each device to be shielded and overlapping with saw streets 102. In one embodiment, trench 242 extends down the middle of each device as with trench 140, and also completely around one side of the device along saw streets 102. When the devices are singulated, the singulation is partially through the lid formed in trench 242.

In FIG. 8b, a lid 250 is formed or disposed within trenches 242. Lid 250 is similar to lid 150, and can be formed by depositing a conductive paste, conductive ink, or another conductive material within trench 242. Alternatively, lid 250 can be formed separately and then inserted into the trench.

Film 256 is applied over the top surface of panel 240 in FIG. 8c. Film 256 is similar to film 152 above, and covers all of the top surface of panel 240 other than lid 250 and the area encompassed by the lid. Film 256 can have openings cut in advance that correspond to the shape of lid 250, or the film can entirely cover panel 240 and then openings are formed by laser ablation, etching, or another suitable process.

Figure 8F:
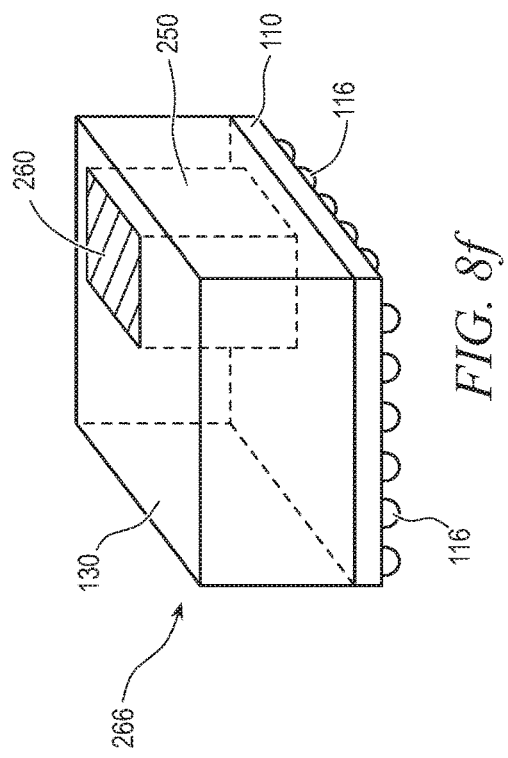

In FIG. 8d, shielding layer 260 is formed over panel 240, including film 256. Shielding layer 260 is similar to shielding layer 160 above. Film 256 is removed in FIG. 8e to leave shielding layer 260 only over lid 250 and the area encompassed by lid 250. Singulation along saw streets 102 result in a SiP device 266 as shown in FIG. 8f. A shielded region of SiP device 266 is completely surrounded by lid 250 and covered by shielding layer 260. Devices within lid 250, e.g., semiconductor package 50, are well protected from EMI while devices outside lid 250 are able to broadcast and receive electromagnetic signals.

Usage of lid 250 to surround an area to be shielded rather than lid 150 to partition a semiconductor package into two regions is compatible with the above illustrated processing methods. For instance, SiP device 266 can be singulated prior to application of film 256, and then flip loaded onto a film as in FIG. 6. In some embodiments, film 256 is formed outside the area encompassed by lid 250, rather than within lid 250. Then when film 256 is removed, the area outside of lid 250 remains shielded while the devices within lid 250 have no shielding above them, allowing transmission of electromagnetic signals. A shielding layer formed on the side surfaces of the package, such as shielding layer 160 in FIG. 2l, would result in the area outside of lid 250 being completely surrounded on top and all sides, while the components surrounded by lid 250 have no lid above.

Figure 9A:
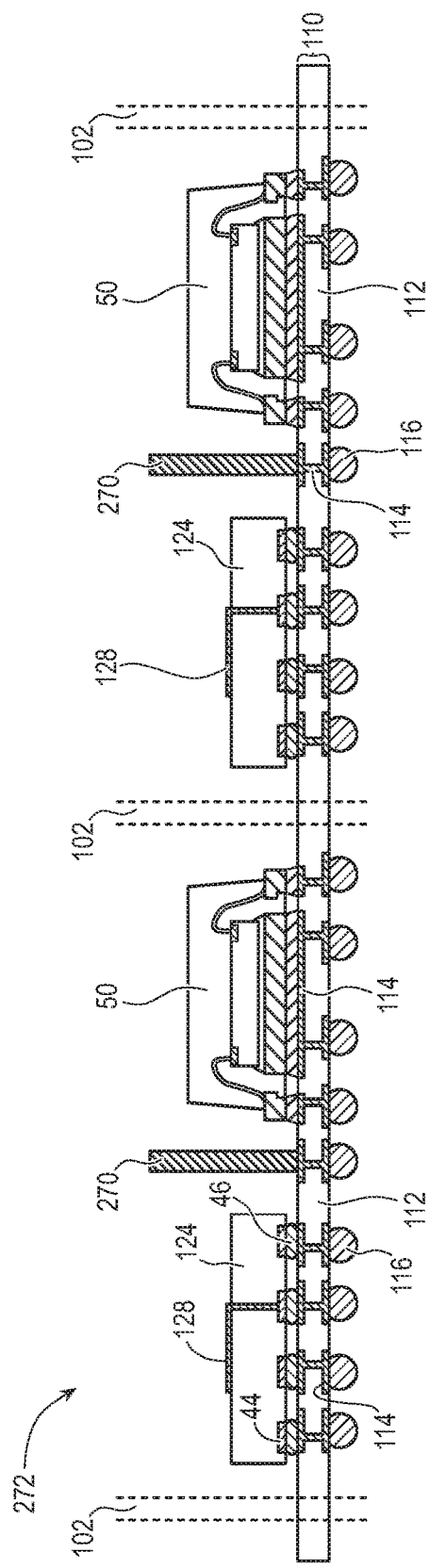
FIGS. 9a and 9b illustrate an alternative order of steps for forming a partial EMI shield.
Figure 9B:
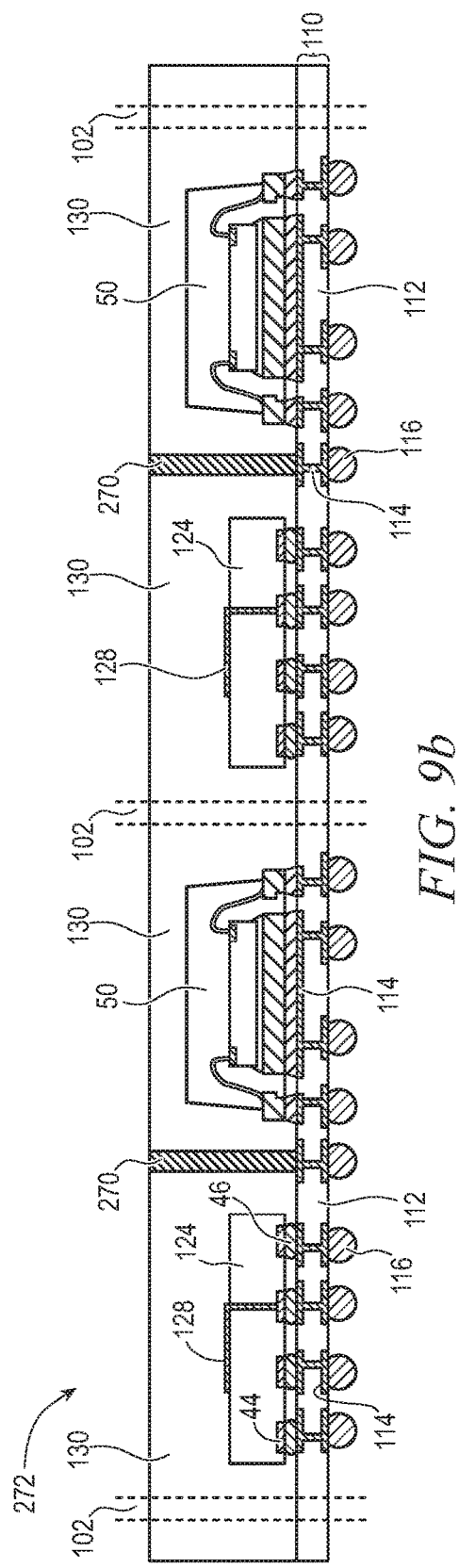

FIGS. 9a and 9b illustrate an alternative order of processing steps where the lid is formed before depositing the encapsulant. In FIG. 9a, lid 270 is formed, disposed, or mounted on substrate 110 between semiconductor die 124 and semiconductor package 50. Lid 270 can be provide before or after other components are mounted on substrate 110. Lid 270 can be formed separately and disposed over substrate 110, or formed directly on substrate 110, e.g., by using a masking layer. Lid 270 can be linear and split each device in two as with lid 150 above, or can surround the area to be protected like lid 250.

In FIG. 9b, encapsulant 130 is deposited over semiconductor die 124, package 50, lid 270, and substrate 110. In some embodiments, the top surface of encapsulant 130 is planarized to expose lid 270. Once encapsulant 130 is deposited, any of the above procedures can be carried out to form a partial shielding layer over the packages. FIG. 9b is in the same state as either FIG. 2c or FIG. 8b above. Any of the above devices could have had the lid 150 or 250 formed prior to deposition of encapsulant 130.

Figure 10A:
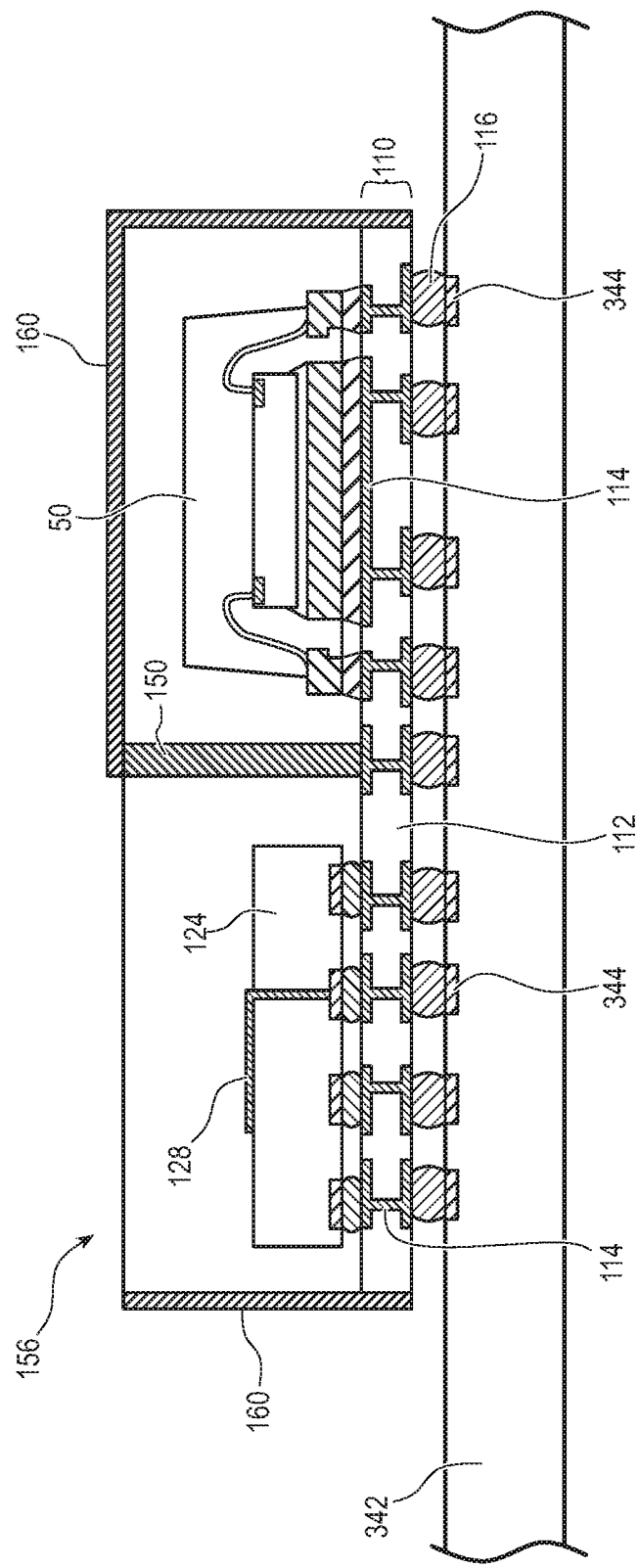
FIGS. 10a and 10b illustrate integrating a SiP device into an electronic device.
Figure 10B:
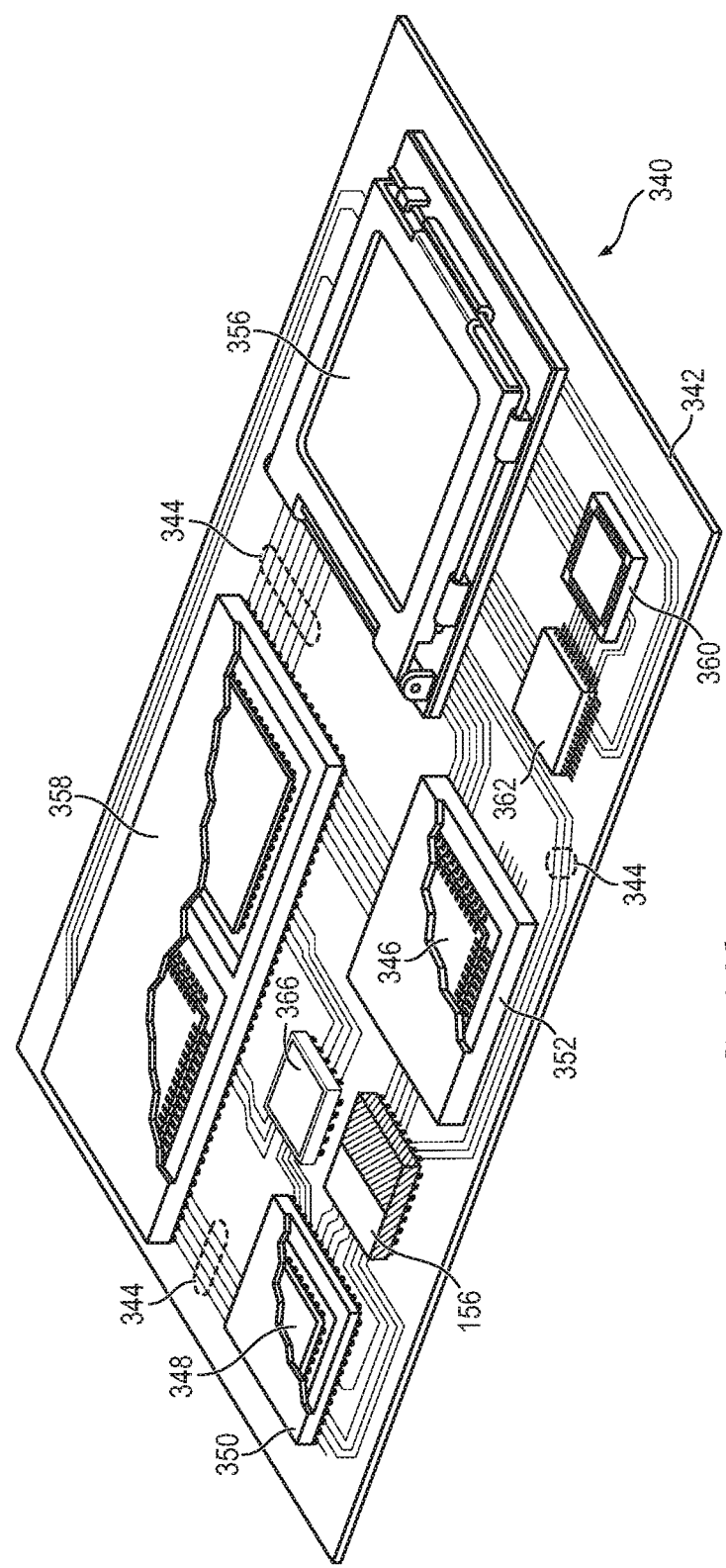

FIGS. 10a and 10b illustrate incorporating any of the above described SiP devices, e.g., SiP device 156, into an electronic device. FIG. 10a illustrates a partial cross-section of SiP device 156 from FIG. 2l mounted onto a PCB or other substrate 342 as part of an electronic device. Bumps 116 are reflowed onto conductive layer 344 of PCB 342 to physically attach and electrically connect SiP device 156 to the PCB. In other embodiments, thermocompression or other suitable attachment and connection methods are used. Rather than bumps, interconnect can be provided through stud bumps, lands, pins, bond wires, or any other suitable structure. In some embodiments, an adhesive or underfill layer is used between SiP device 156 and PCB 342. Semiconductor die 124 and package 50 are electrically coupled to conductive layer 344 and each other through conductive layer 114 and bumps 116.

FIG. 10b illustrates electronic device 340 including PCB 342 with a plurality of semiconductor packages mounted on a surface of the PCB, including SiP device 156. Electronic device 340 can have one type of semiconductor package, or multiple types of semiconductor packages, depending on the application.

Electronic device 340 can be a stand-alone system that uses the semiconductor packages to perform one or more electrical functions. Alternatively, electronic device 340 can be a subcomponent of a larger system. For example, electronic device 340 can be part of a tablet computer, cellular phone, digital camera, communication system, or other electronic device. Electronic device 340 can also be a graphics card, network interface card, or other signal processing card that is inserted into a computer. The semiconductor packages can include microprocessors, memories, ASICs, logic circuits, analog circuits, RF circuits, discrete active or passive devices, or other semiconductor die or electrical components.

In FIG. 10b, PCB 342 provides a general substrate for structural support and electrical interconnection of the semiconductor packages mounted on the PCB. Conductive signal traces 344 are formed over a surface or within layers of PCB 342 using evaporation, electrolytic plating, electroless plating, screen printing, or other suitable metal deposition process. Signal traces 344 provide for electrical communication between the semiconductor packages, mounted components, and other external systems or components. Traces 344 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 342. In other embodiments, a semiconductor device may only have the first level packaging where the die is mechanically and electrically mounted directly to PCB 342.

For the purpose of illustration, several types of first level packaging, including bond wire package 346 and flipchip 348, are shown on PCB 342. Additionally, several types of second level packaging, including ball grid array (BGA) 350, bump chip carrier (BCC) 352, LGA 356, multi-chip module (MCM) 358, quad flat non-leaded package (QFN) 360, and wafer level chip scale package (WLCSP) 366 are shown mounted on PCB 342 along with SiP device 156. Conductive traces 344 electrically couple the various packages and components disposed on PCB 342 to SiP device 156, giving use of the components within the SiP device to other components on the PCB.

Depending upon the system requirements, any combination of semiconductor packages, configured with any combination of first and second level packaging styles, as well as other electronic components, can be connected to PCB 342. In some embodiments, electronic device 340 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate;
   disposing an electromagnetic interference (EMI) shield over the substrate to surround a component disposed over the substrate;
   depositing an encapsulant over the substrate;
   disposing a film mask over the encapsulant, wherein the film mask extends over a plurality of system-in-package (SiP) devices formed on the substrate;
   forming an opening in the film mask over the EMI shield and component, wherein the EMI shield is exposed from the film mask and encapsulant;
   singulating the plurality of SiP devices after disposing the film mask over the encapsulant;
   forming a conductive layer over the film mask, encapsulant, and EMI shield after singulating the substrate; and
   removing the film mask after forming the conductive layer.

2. The method of claim 1, further including applying the film mask with a jig.

3. The method of claim 1, wherein singulating the substrate and encapsulant also cuts the film mask into a plurality of portions.

4. The method of claim 1, wherein the film mask completely surrounds the opening after singulating the substrate and encapsulant.

5. A method of making a semiconductor device, comprising:
   providing a substrate;
   depositing an encapsulant over the substrate;
   forming a trench in the encapsulant, wherein the trench exposes the substrate from the encapsulant;
   depositing a conductive material into the trench to form an electromagnetic interference (EMI) shield;
   disposing a film mask over the encapsulant;
   forming a conductive layer over the film mask, encapsulant, and EMI shield, wherein the conductive layer extends over a top surface and a side surface of the encapsulant; and
   removing the film mask after forming the conductive layer.

6. The method of claim 5, further including disposing the film mask on a side surface of the encapsulant.

7. The method of claim 5, further including disposing the film mask over the encapsulant with the EMI shield exposed from the encapsulant and film mask.

8. The method of claim 5, wherein the film mask includes an opening over the encapsulant.

9. The method of claim 5, further including singulating the substrate and encapsulant into a plurality of system-in-package (SiP) devices after disposing the film mask over the encapsulant and before forming the conductive layer.

10. The method of claim 5, further including singulating the substrate and encapsulant into a plurality of system-in-package (SiP) devices prior to disposing the film mask over the encapsulant and prior to forming the conductive layer.

11. The method of claim 10, further including:
    disposing the plurality of SiP devices on a carrier with a gap between each pair of adjacent SiP devices; and
    disposing the film mask extending to each of the SiP devices.

12. A method of making a semiconductor device, comprising:
    providing a first SiP device;
    providing a second SiP device;
    singulating the first SiP device and second SiP device;
    disposing a film mask over the first SiP device and second SiP device after singulating;
    forming a conductive layer over the film mask, wherein the conductive layer extends over a side surface of the first SiP device; and
    removing the film mask.

13. The method of claim 12, further including disposing the film mask using a jig.

14. The method of claim 12, further including forming an electromagnetic interference (EMI) shield in the first SiP device.

15. The method of claim 12, further including cutting the film mask after disposing the film mask over the first SiP device and second SiP device.

16. The method of claim 12, further including:
    disposing the first SiP device and second SiP device on a carrier with a gap between the first SiP device and second SiP device; and
    disposing the film mask to span the gap.

17. The method of claim 12, further including a third SiP device singulated from the first SiP device and second SiP device, wherein the film mask extends continuously from the first SiP device to the second SiP device and third SiP device.

18. A method of making a semiconductor device, comprising:
    providing a substrate;
    disposing an electromagnetic interference (EMI) shield over the substrate;
    depositing an encapsulant over the substrate and around the EMI shield;
    disposing a film mask over the encapsulant; and
    forming a conductive layer over the EMI shield, film mask, and a first portion of a top surface of the encapsulant, wherein the conductive layer extends over a side surface of the encapsulant and the film mask is disposed between the conductive layer and encapsulant.

19. The method of claim 18, further including forming the conductive layer in contact with a top surface and a side surface of the EMI shield.

20. The method of claim 18, wherein a second portion of the top surface of the encapsulant is devoid of the conductive layer.

21. The method of claim 18, wherein the EMI shield surrounds a component disposed on the substrate.

22. The method of claim 18, further including singulating the substrate and encapsulant into a plurality of system-in-package (SiP) devices after disposing the film mask over the encapsulant and before forming the conductive layer.

23. The method of claim 22, further including forming an opening in the film mask over each of the SiP devices.

* * * * *